United States Patent [19]

Best et al.

[11] Patent Number: 5,582,104

[45] Date of Patent: Dec. 10, 1996

[54] APPARATUS AND PROCESS FOR SCREEN PRINTING

[75] Inventors: David R. Best, Los Alamos; Burt DeVolk, Albuquerque, both of N.M.

[73] Assignee: Printron, Inc., Albuquerque, N.M.

[21] Appl. No.: 158,839

[22] Filed: Nov. 29, 1993

Related U.S. Application Data

[63] Continuation of Ser. No. 852,049, Mar. 16, 1992, abandoned.

[51] Int. Cl.$^6$ .................................................. B41F 15/20
[52] U.S. Cl. ...................... 101/126; 101/127.1; 101/129; 101/DIG. 36
[58] Field of Search .................................. 101/126, 127, 101/127.1, 129, 481, 485, 486, DIG. 36

[56] References Cited

U.S. PATENT DOCUMENTS

| | | | |
|---|---|---|---|
| 2,239,619 | 4/1941 | Murgatroyd et al. | 101/115 |
| 2,796,831 | 6/1957 | Heestand | 101/126 |
| 2,963,964 | 12/1960 | Klump | 101/126 |
| 3,098,431 | 7/1963 | Weaver | 101/126 |
| 3,138,095 | 6/1964 | Wells | 101/126 |
| 3,150,583 | 9/1964 | Reed, III et al. | 355/131 |
| 3,172,358 | 3/1965 | Weiss | 101/126 |
| 3,221,648 | 12/1965 | Weiss | 101/129 |
| 3,221,649 | 12/1965 | Weiss | 101/126 |
| 3,372,638 | 3/1968 | Tripp | 101/114 |
| 3,463,587 | 8/1969 | Oltra et al. | 355/93 |
| 3,776,382 | 12/1973 | Wright et al. | 101/127.1 |
| 3,788,216 | 1/1974 | Lambert | 101/127.1 |
| 3,871,293 | 3/1975 | Valiela | 101/41 |
| 3,964,385 | 6/1976 | Knight | 101/128.4 |
| 3,991,677 | 11/1976 | Barnes | 101/127.1 |
| 4,083,301 | 4/1978 | Black | 101/128.3 |
| 4,244,109 | 1/1981 | Silverman | 101/DIG. 36 |
| 4,327,124 | 4/1982 | DesMarais, Jr. | 427/96 |
| 4,388,862 | 6/1983 | Thomas, Jr. | 101/126 |
| 4,457,861 | 7/1984 | DesMarais, Jr. | 252/512 |
| 4,463,673 | 8/1984 | Moore | 101/129 |
| 4,481,881 | 11/1984 | Okano | 101/126 |
| 4,484,813 | 11/1984 | Maher et al. | 355/93 |
| 4,519,760 | 5/1985 | Norell | 101/126 |
| 4,649,817 | 3/1987 | Smith | 101/129 |
| 4,678,531 | 7/1987 | Metzger et al. | 156/250 |
| 4,696,228 | 9/1987 | David et al. | 101/126 |
| 4,747,211 | 5/1988 | Gilleo et al. | 29/852 |
| 5,050,498 | 9/1991 | Smith | 101/129 |

FOREIGN PATENT DOCUMENTS

| | | | |
|---|---|---|---|
| 44656 | 4/1981 | Japan | 101/126 |
| 177357 | 10/1983 | Japan | 101/126 |
| 178811 | 10/1984 | Japan | 101/126 |
| 139744 | 6/1988 | Japan | 101/129 |
| 79347 | 4/1991 | Japan | 101/129 |

OTHER PUBLICATIONS

Western Electric Technical Digest No. 38, Apr. 1975, "Substrate Holding Device For Use in Screen Printing Machines", F. J. Gryl, pp. 15, 16.

*Primary Examiner*—Stephen Funk
*Attorney, Agent, or Firm*—Lowe, Price, Leblanc & Becker

[57] ABSTRACT

An apparatus and method for vacuum printing inks onto a substrate in which the printing screen is mounted in a pivotable screen holder. The substrate is positioned on a printing platen and adhered to the platen during the printing operation by a vacuum hold-down system. The platen rests upon a product carrier which may be moved in a direction normal to the surface of the printing platen in order to adjust the spacing between the substrate and printing screen. The printing screen may be registered with the substrate by adjusting the position of the screen holder along two axes defining the screen plane and about a third axis normal to the screen plane. During printing the screen is deflected into contact with the substrate by a vacuum hold-down system. The system is configured to minimize the volume of air which must be evacuated during the printing operation.

27 Claims, 18 Drawing Sheets

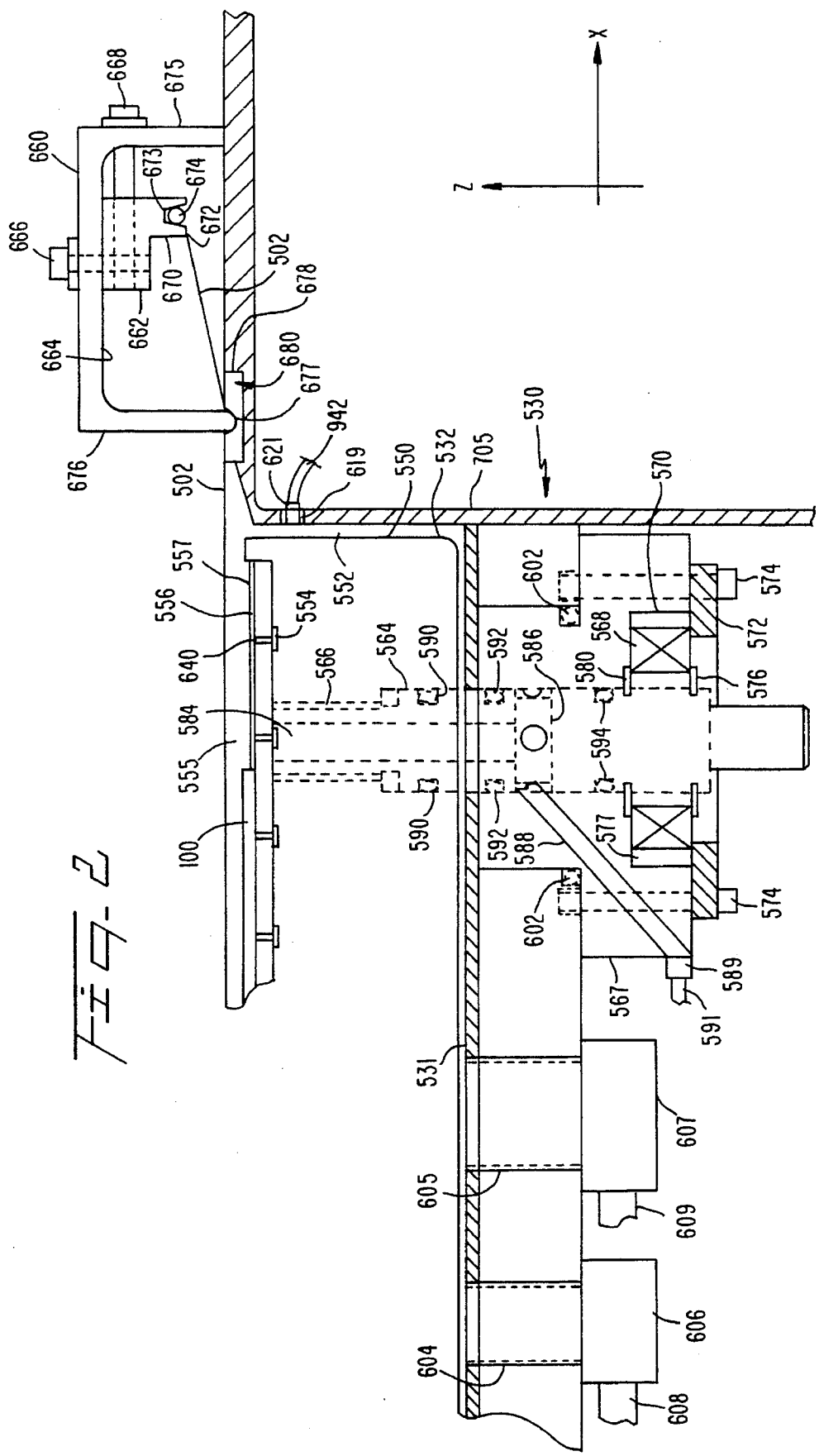

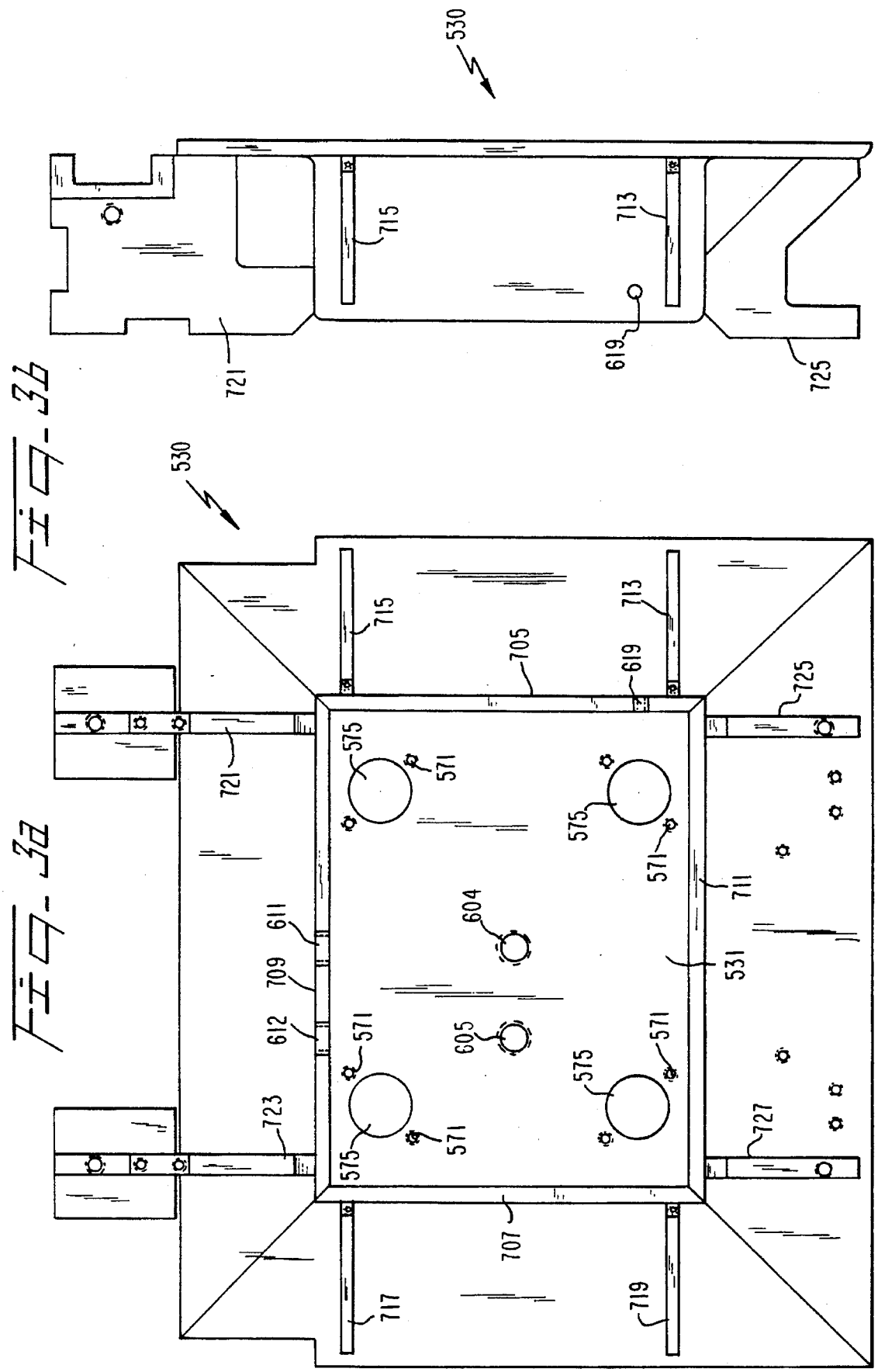

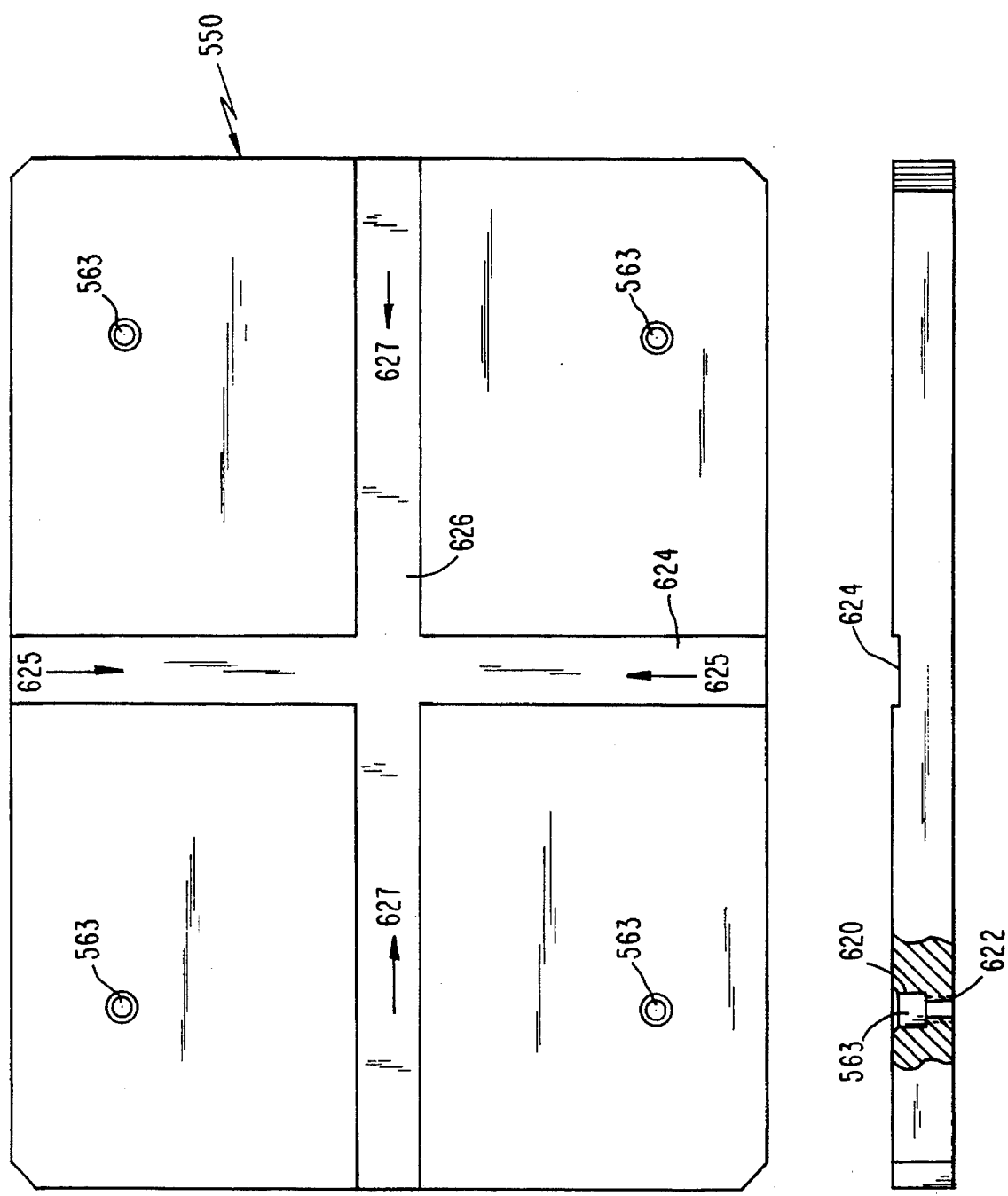

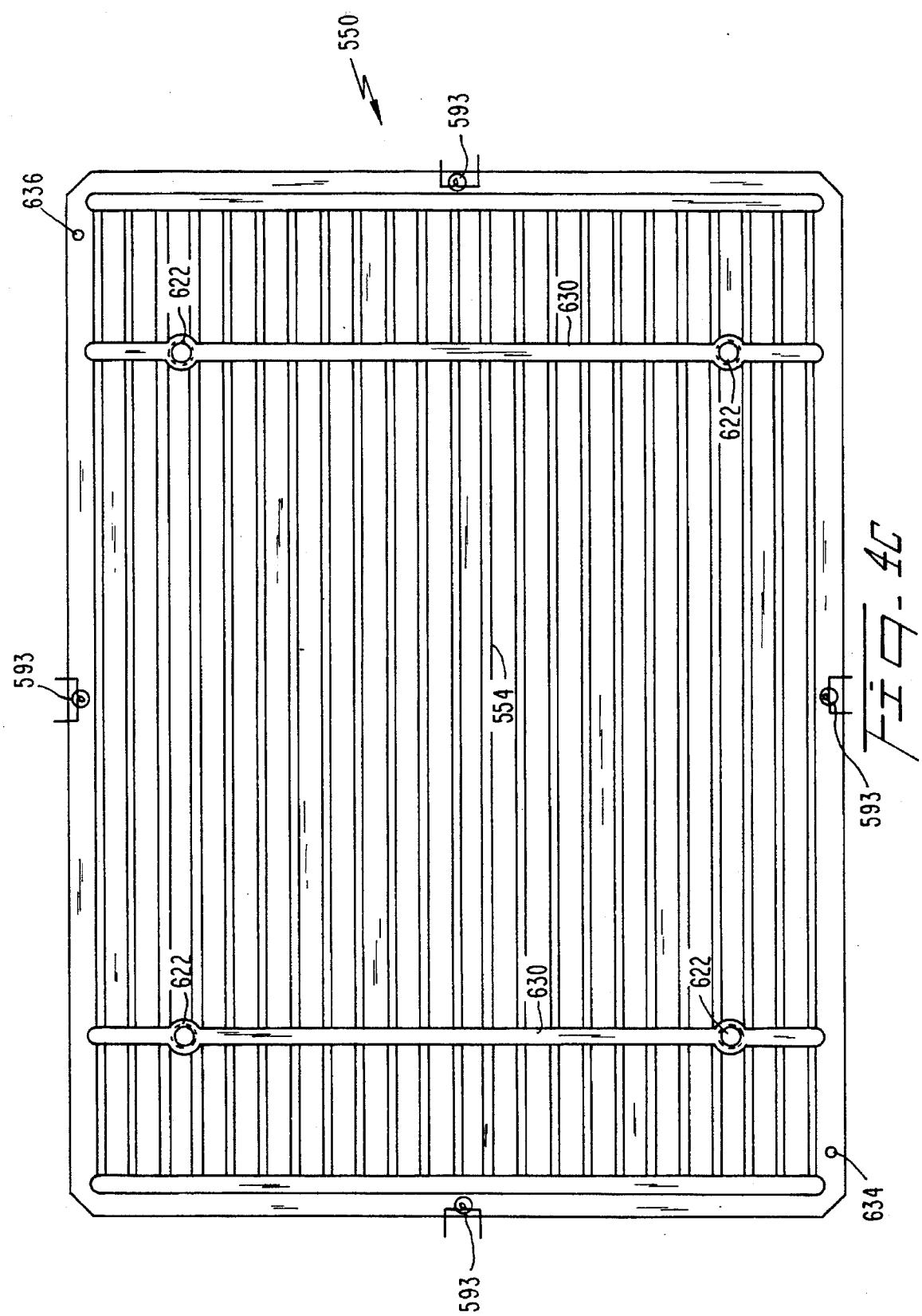

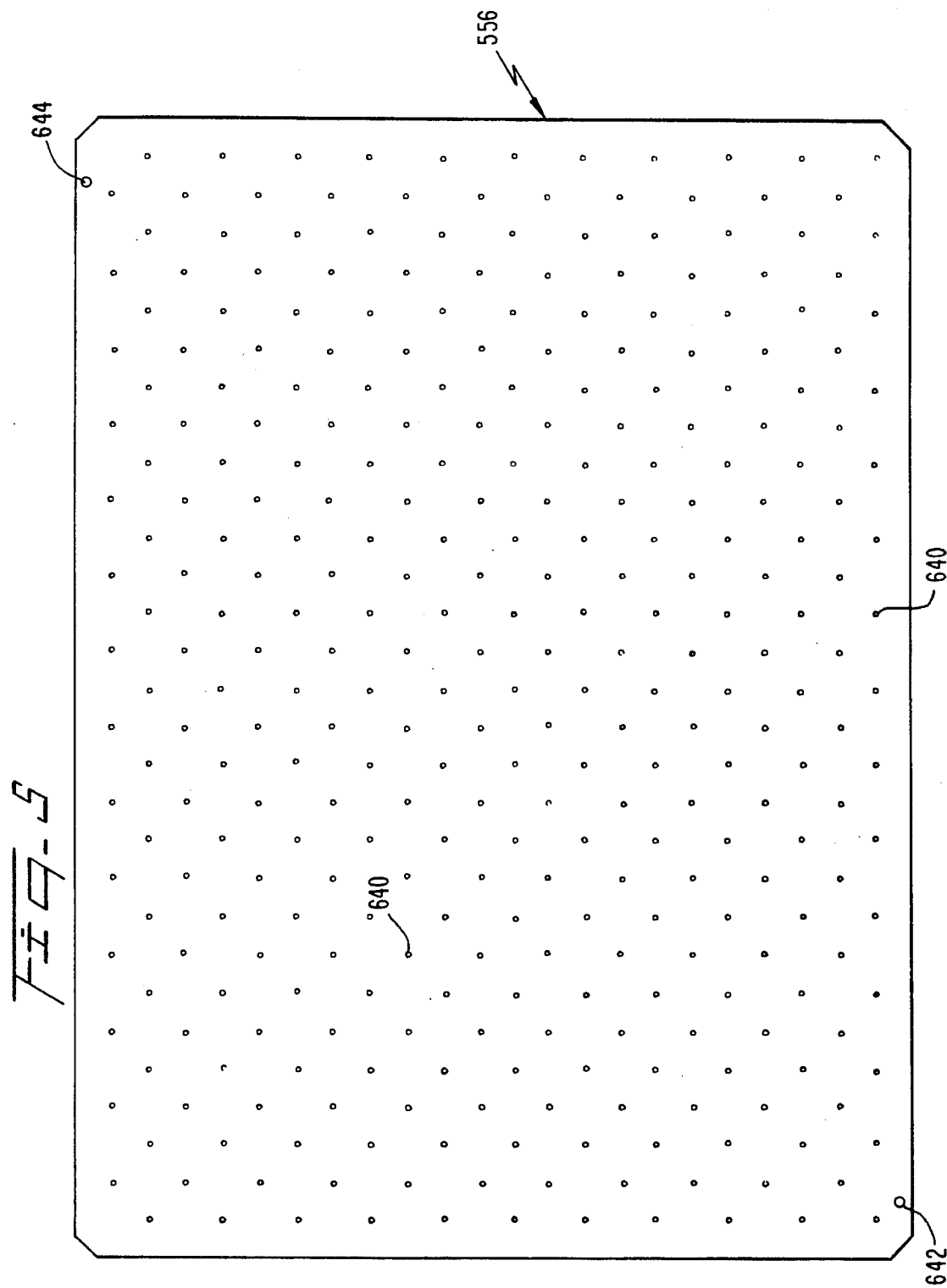

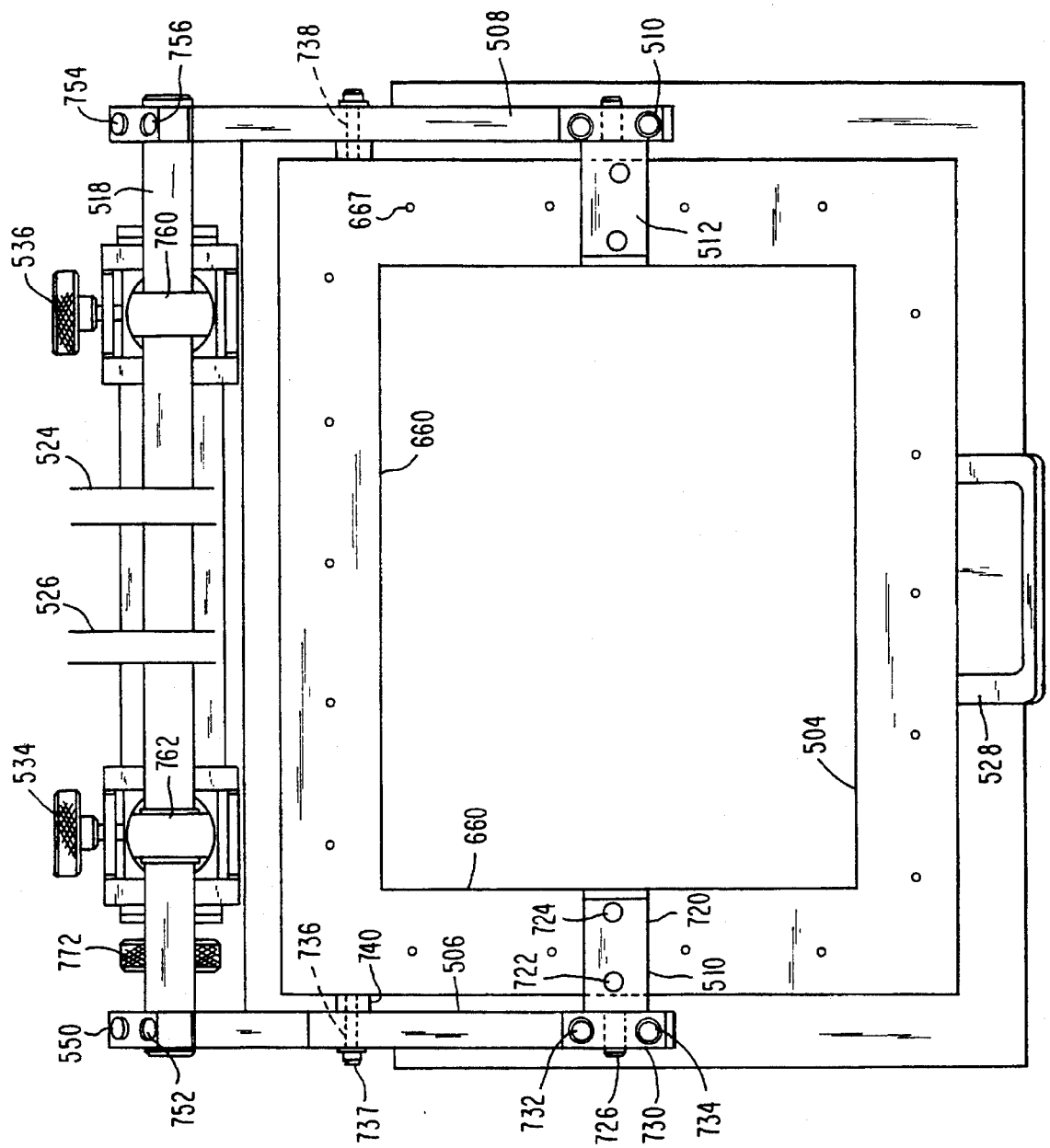

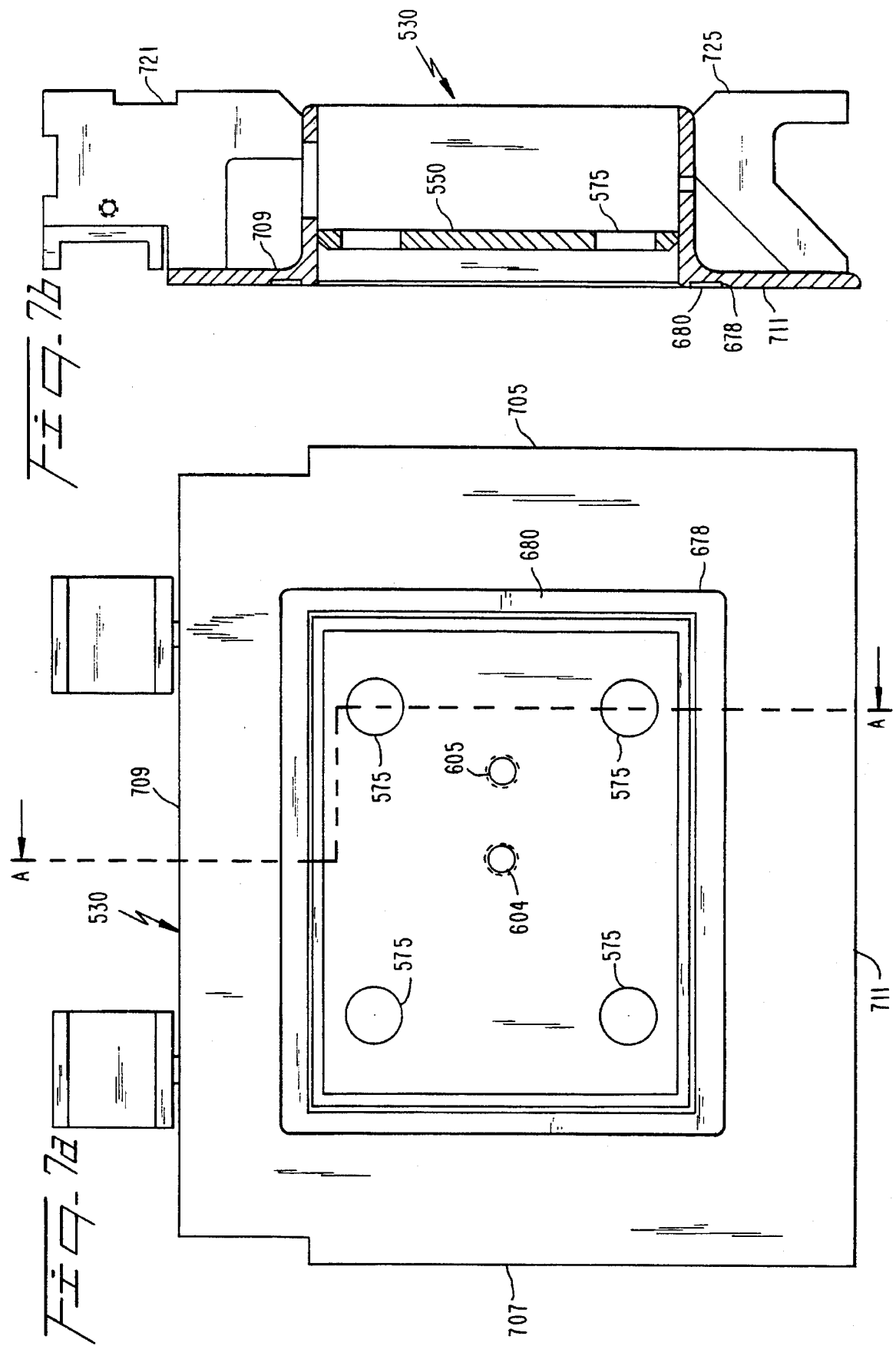

Fig. 8

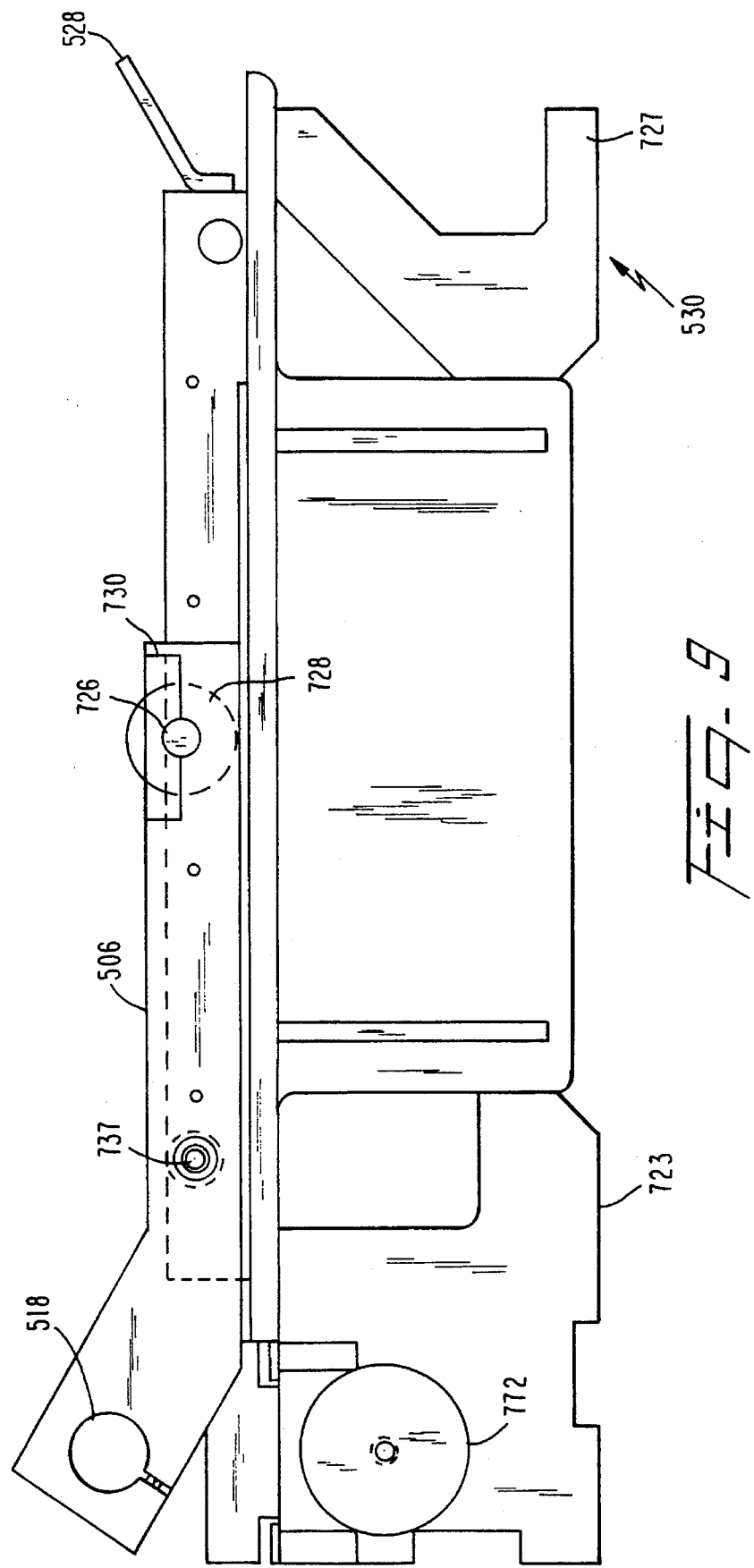

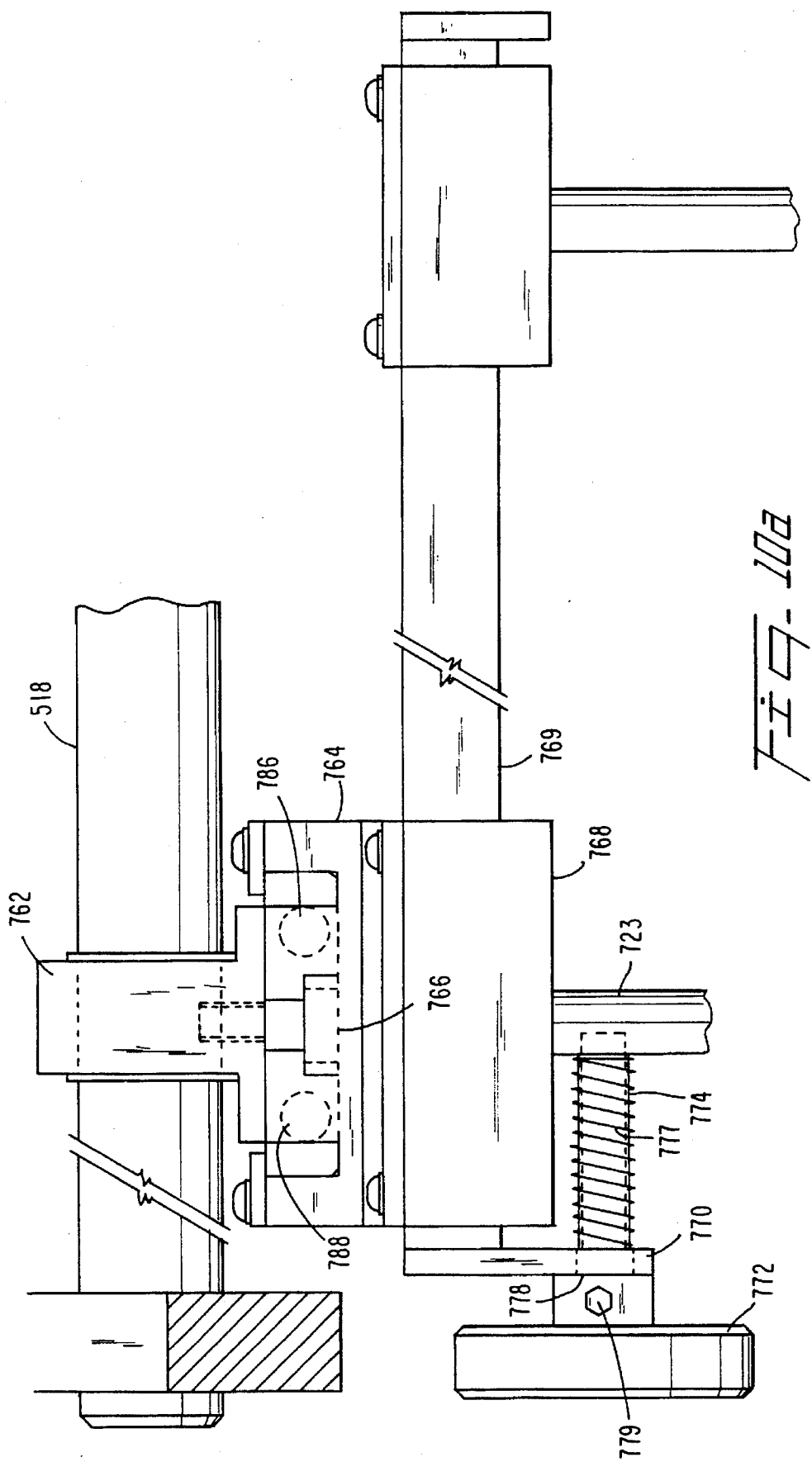

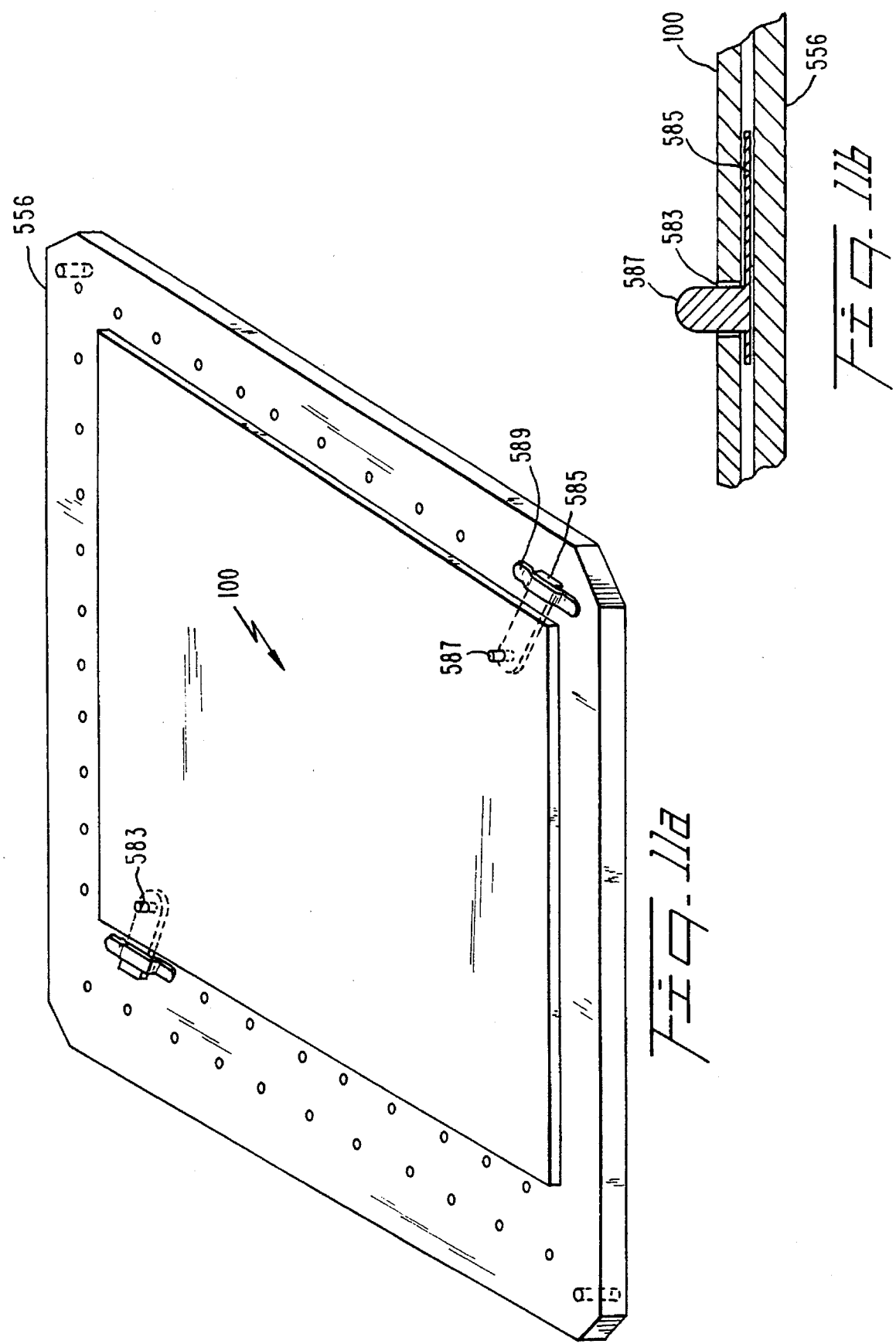

APPARATUS AND PROCESS FOR SCREEN PRINTING

This is a continuation of application Ser. No. 07/852,049, filed Mar. 16, 1992, now abandoned.

This invention relates generally to silk screen printing and more particularly to an improved apparatus and process for vacuum screen printing.

BACKGROUND ART

Screen printing is a well-established art in which ink is transferred through openings in a screen defining a desired pattern onto a substrate. This process is used to print on a variety of substrates, such as tee shirts, textile, plexiglass sheets and printed circuit board substrates. After a stencil has been made defining the desired pattern, it is mounted in a frame, the frame is positioned over the substrate, ink is applied to the upper surface of the screen and the ink is then transferred through the screen openings onto the substrate.

Conventional methods for transferring ink include use of squeegees or vacuum pressure. In the former method a squeegee slightly wider than the image is placed behind the ink, pressed down on top of the screen and moved with even pressure across the image area forcing the ink through the open spaces on the screen onto the substrate. When the screen is raised the ink passed through the holes remains on the substrate. In the latter method ink is placed over the openings and a vacuum is drawn in the region between the substrate and screen, causing the screen to deflect downwardly into contact with the substrate, whereupon the ink is drawn through the openings into contact with the substrate.

A number of problems exist in prior art vacuum printers. First, it is difficult to precisely align the screen with the underlying substrate, especially in applications having small tolerances, such as the manufacture of printed circuit boards.

Second, the substrate/ink interface forms a meniscus coupling at the time of printing that bonds the print screen and substrate together. This coupling interferes with release of the screen from the substrate which can smear the ink pattern deposited on the substrate. This problem may be especially acute if the print screen is larger than the substrate.

Accordingly, one object of the present invention is to provide a new and improved apparatus for and method of vacuum screen printing.

Another object of the invention is to provide a new and improved apparatus for and method of manufacturing printed circuit boards.

Yet another object of the present invention is to provide a screen printing apparatus in which the printing screen may be accurately registered with the underlying substrate.

A further object of the invention is to provide a vacuum screen printing system which minimizes smearing of the printed pattern on the substrate.

Additional objects, advantages and novel features of the invention will be set forth in part in the description which follows, and in part will become apparent to those skilled in the art upon examination of the following or may be learned by practice of the invention. The objects and advantages of the invention may be realized and obtained by means of the instrumentalities and combinations particularly pointed out in the appended claims.

SUMMARY OF THE INVENTION

According to the present invention, the foregoing and other objects are obtained by providing an apparatus for depositing inks onto a substrate in a predetermined pattern comprising a screen holder to which a printing screen may be removably attached, a platen for supporting the substrate in a normally spaced relationship from the printing screen, a product carrier for supporting the platen, a first device coupled to the support frame and the product carrier for adjusting the position of the product carrier relative to the support frame along a first axis, and a positioning device coupled to the screen holder for adjusting the position thereof around the first axis, along the second axis orthogonal to the first axis and along the third axis orthogonal to the first axis and second axis for registering the printing screen with the substrate.

The adjusting device includes a pair of rotatable handles coupled through gears to the product carrier. The positioning device comprises a pair of adjusting knobs which may be rotated to adjust the position of the screen holder around the first axis and along the second axis orthogonal thereto, and another adjusting knob for moving the screen holder along the third axis until the printing screen is registered with the underlying substrate.

In accordance with another aspect of the invention, the foregoing and other objects are obtained by providing a method for depositing an ink "slurry" including conductive metal particles and organic carriers onto a non-conductive substrate. In this method a substrate is positioned onto a printing platen, a screen having the predetermined pattern defined therein is moved into registration with the substrate at a predetermined distance above the substrate, the ink slurry is applied to the upper surface of the printing screen, and a partial vacuum is then applied to the region between the substrate and screen, whereby the screen is deflected into contact with the substrate and a portion of the conductive ink is transferred through the screen onto the substrate in a predetermined pattern.

BRIEF DESCRIPTION OF THE DRAWINGS

FIG. 2 is an illustration of a cross-sectional view of the screen holder, support frame and hold-down mechanism of the present invention, taken along the section line A—A shown in FIG. 7a.

FIGS. 3a and 3b are, respectively, the bottom view and side view of the support frame of the present invention.

FIGS. 4a, 4b and 4c are, respectively, the bottom, side and top views of the product carrier of the present invention.

FIG. 5 is a top view of the platen of the present invention.

FIG. 6 is a top view of the screen holder and frame mount arms of the present invention.

FIG. 7a is a top view of the support frame of FIGS. 3a and 3b.

FIG. 7b is a sectional view of the support frame of FIG. 7a, taken along the section line A—A.

FIG. 8 is a bottom view of the support frame, including the apparatus for adjusting the vertical positioning of the product carrier.

FIG. 9 is a side view of the screen holder and support frame included in the apparatus of FIG. 1.

FIGS. 10a, 10b and 10c are side, top and end views, respectively, of the screen holder adjustment mechanism included in the apparatus of FIG. 1.

FIG. 11a is a perspective view of a substrate mounted on the printing platen in the apparatus of FIG. 1.

FIG. 11b is a cross-sectional view of the locator tabs used for mounting the substrate to the platen, as shown in FIG. 11a.

Description of the Preferred Embodiment

A. System Overview

Figure 1:
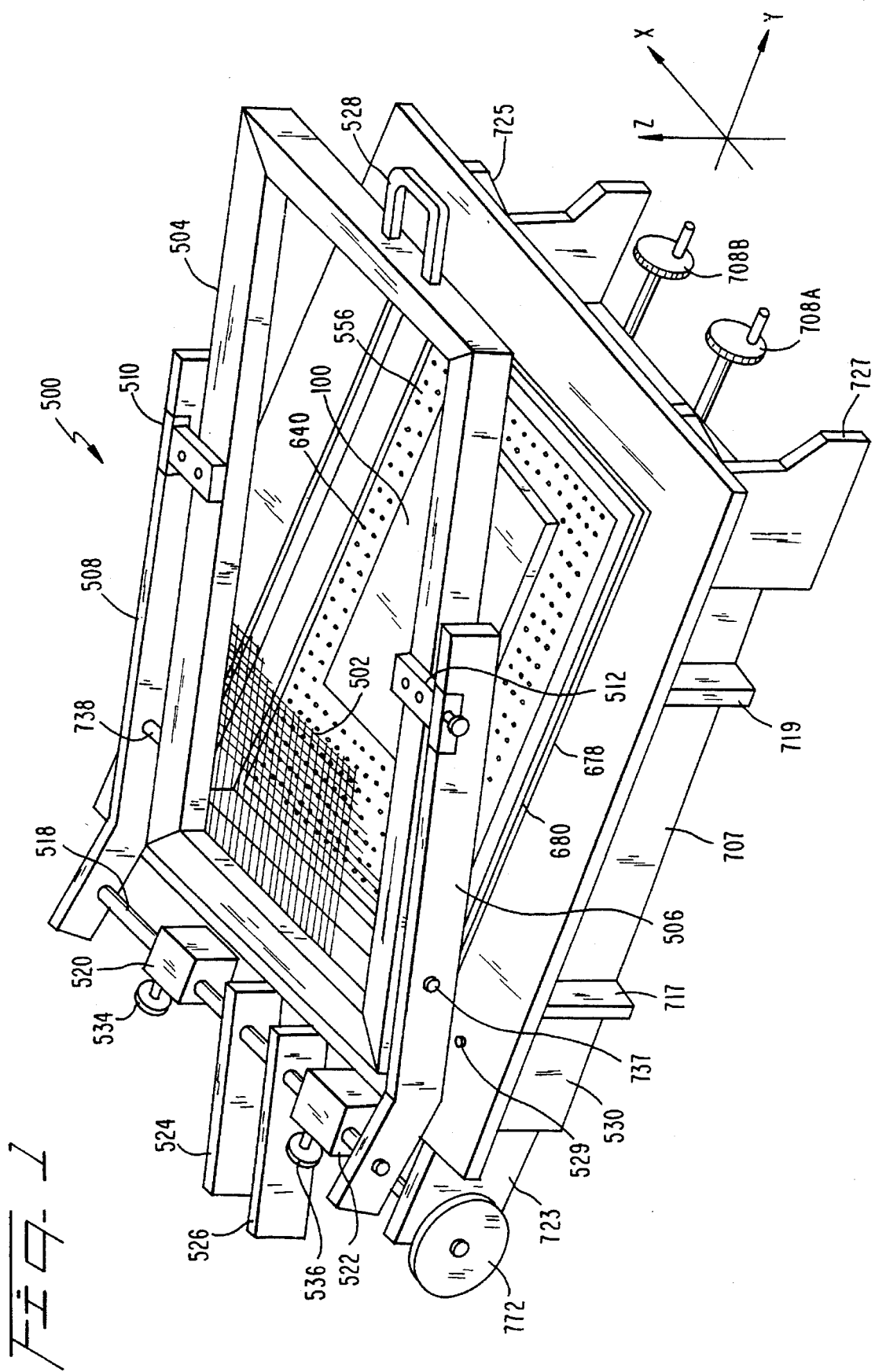
FIG. 1 is a perspective view of the screen printer of the present invention.

A perspective view of the present invention is shown in FIG. 1. The printer 500 uses the vacuum pull-down method for deflecting a printing screen 502, which is coated with viscous ink, into contact with a substrate 100. In the preferred embodiment the substrate is a printed circuit board substrate having a plurality of conventional pre-drilled holes (not shown) used for mounting electronic components, and the ink comprises conductive metal particles suspended in a viscous carrier or screening agent. It should be understood, however, that other types of substrates and inks may be used with this printer (all such materials are collectively referred to hereafter as "ink").

Printing screen 502, in which a desired printing pattern has been formed by conventional means, including a plurality of conventional circular openings corresponding to the pre-drilled component mounting holes in substrate 100, is supported in a screen holder 504. Holder 504 is mounted at either side to frame mount arms 506 and 508 by support members 510 and 512 and bolts 737 and 738. Frame mount arms 506 and 508 are fixably mounted at one end to pivot bar 518. Pivot bar 518 extends through a pair of positioning devices 520 and 522, described hereinafter, which are used to adjust the position of pivot bar 518 along the Y-axis and around the Z-axis (commonly referred to as the "theta axis"). Positioning devices 520 and 522 are manually controlled, respectively, by knobs 534 and 536. Adjusting knob 772 is used to adjust the position of screen holder 504 along the X-axis. Thus, by turning knobs 534, 536 and 772, the operator can adjust the position of screen holder 504 until screen 502 is precisely registered above substrate 100.

A pair of counterweights 524 and 526 are rigidly attached to pivot bar 518, allowing the operator to easily rotate screen holder 504 about pivot bar 518. Alternatively, air springs may be used for this purpose. The operator does so by grasping handle 528 and either lifting it until the screen holder is in the fully opened position or pushing it downward until the bottom edges of the screen holder contact vacuum seal 680 inserted into a channel 678 in the upper surface of support frame 530. Support frame 530 has a central recess therein, in which substrate 100 is positioned on top of printing platen 556. Platen 556 is bonded to a product carrier 550 (illustrated in FIG. 2). Product carrier 550 and, hence, platen 556 may be adjusted along the Z axis by rotating knobs 708A and 708B, to thereby space substrate 100 from screen 502 to the desired degree. Platen 556 has regularly spaced vacuum hold-down holes 640 therein used for substrate hold-down, as described below. Non-porous tape 557 (FIG. 2) is used to cover the apertures in platen 556 not covered by the substrate.

When screen holder 504 is rotated to the fully down position, the rear section thereof depresses a micro-switch 529, which causes a vacuum to draw substrate 100 into firm contact with platen 556, thereby preventing relative movement between them during the printing operation. In the down position the surface of screen 502 is essentially parallel to the surface of substrate 100. After ink has been applied to the upper surface of screen 502, filling all of the unmasked screen openings, vacuum print system 900 (FIG. 12) is energized, as described hereinafter. This system evacuates the region between substrate 100 and screen 502, causing screen 502 to deflect downward into contact with substrate 100 and ink to be transferred through the screen openings onto the substrate.

After ink transfer, the vacuum is released and the operator rotates screen holder 504 away from substrate 100, removes the substrate from the printer and inserts the next substrate for printing. Concurrent with release of the print vacuum, a pilot actuated valve 922 (see FIG. 12) is operated to vent the print chamber to atmospheric pressure, thereby avoiding a double strike of ink onto the substrate. Upon rotating screen holder 504 away from substrate 100, micro-switch 529 is opened, shutting off the hold-down vacuum and returning the pneumatic hold-down system 900 to the standby mode. Screen 502 may be removed from holder 504 whenever the operator desires to do so, such as at the end of a production run.

B. Detailed Description of the Preferred Embodiment

FIG. 2 illustrates a sectional view of screen holder 504, support frame 530 and the hold-down mechanism for substrate 100. A product carrier 550 is positioned in recess 532 of the support frame. Referring to FIGS. 7a and 7b, the periphery of recess 532 is defined by the vertical portions of side members 705 and 707, front member 711 and rear member 709, while the bottom of recess 532 is defined by support member 531. The lateral dimensions of product carrier 550 are slightly less than the corresponding dimensions of recess 532, thereby defining an evacuation channel 552 between product carrier 550 and recess 532.

The top surface of product carrier 550 has a series of parallel hold-down channels 554 therein. In the preferred embodiment, product carrier 550 and support frame 530 are made of aluminum, although it should be understood that other materials may be used for these components. Platen 556, which is preferably made of a plastic sheet such as LEXAN®, is positioned on the upper surface of product carrier 550. Platen 556 has a plurality of vacuum hold-down holes 640 in it, as shown in FIG. 5, and these apertures align with hold-down channels 554 when platen 556 is placed on top of product carrier 550. Substrate 100 is positioned on top of platen 556 in the manner described hereinafter. Non-porous tape 557 is taped to the platen on the area not covered by substrate 100.

The vertical position of product carrier 550 is determined by four vertical adjustment bolts 564 threaded into internal threads 566 in product carrier 550, only one of each being shown in FIG. 2. The lower shaft of each bolt 564 is not threaded and passes through a vertical mounting adjustment bracket 567. Each mounting bracket 567 is secured by two mounting bolts 574 to a support member 531 which, in the preferred embodiment, is welded around its periphery to support frame 530. A tapered roller bearing 568 inserted in an annular recess in each bracket 567 facilitates rotation of vertical adjustment bolt 564. Vertical movement of product carrier 550 is determined by bolts 564. Outer race 570 for ball bearing 568 is retained in recess 577 by a retainer plate 572. This plate, in turn, is secured to bracket 567 by mounting bolts 574.

Snap ring 576 is inserted in an annular recess on the shaft of vertical adjustment bolt 564 immediately below tapered roller bearing 568, and snap ring 580 is placed in an annular recess on the shaft of bolt 564 immediately above bearing 568. Snap ring 576 prevents bolt 564, and thus product carrier 550, from moving upward, while snap ring 580 prevents downward movement of bolt 564, and thus product carrier 550, in response to atmospheric pressure against the upper surface of product carrier 550 during printing.

The center portion of bolt 564 is bored out along the vertical or Z-axis forming a hollow shaft 584. This shaft intersects a hollow shaft 586 bored perpendicular thereto. One end of shaft 586 is connected to a bore 588 in bracket 567. A conventional air-tight fitting 589 at the other end of bore 588 is connected to a vacuum hose 591 that is fed to vacuum hold-down system 900, described hereinafter. O-rings 590, 592 and 594 are positioned in annular grooves along the non-threaded portion of bolt 564. These O-rings prevent leakage of the vacuum between the substrate hold-down vacuum path and the print screen deflection vacuum path, described in more detail hereinafter. An O-ring 602 positioned in an annular recess in mounting bracket 567 prevents loss of vacuum between it and support member 531.

FIGS. 3a and 3b depict, respectively, bottom and side views of support frame 530. As shown in FIG. 3a, bores 575, which receive vertical mounting adjustment brackets 567, are spaced symmetrically about support member 531. Also shown are the locations of two threaded holes 571 symmetrically disposed about each bore 575, through which mounting bolts 574 are threaded, thereby securing mounting bracket 567 to support member 531.

Figure 8:
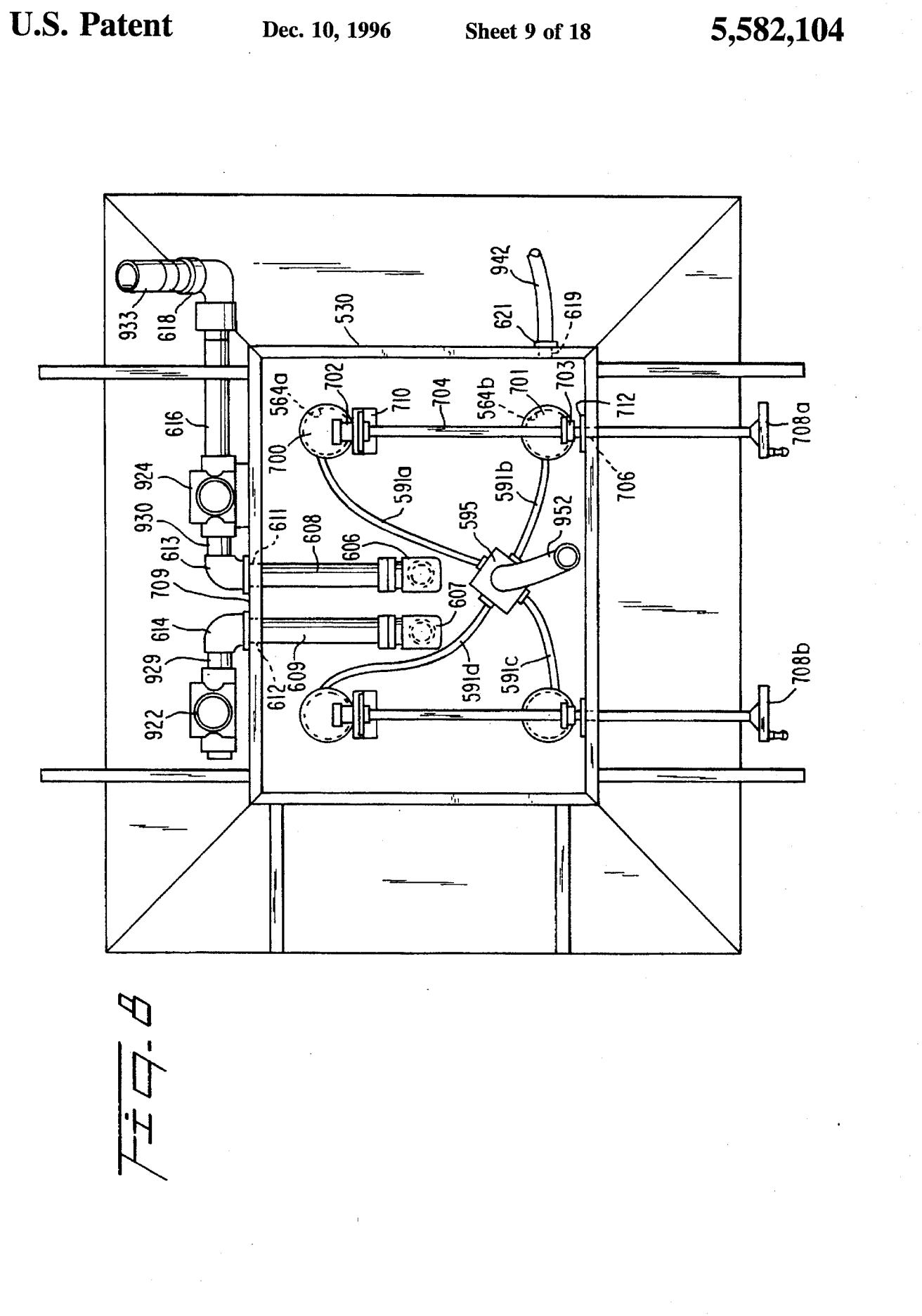
Figure 12:
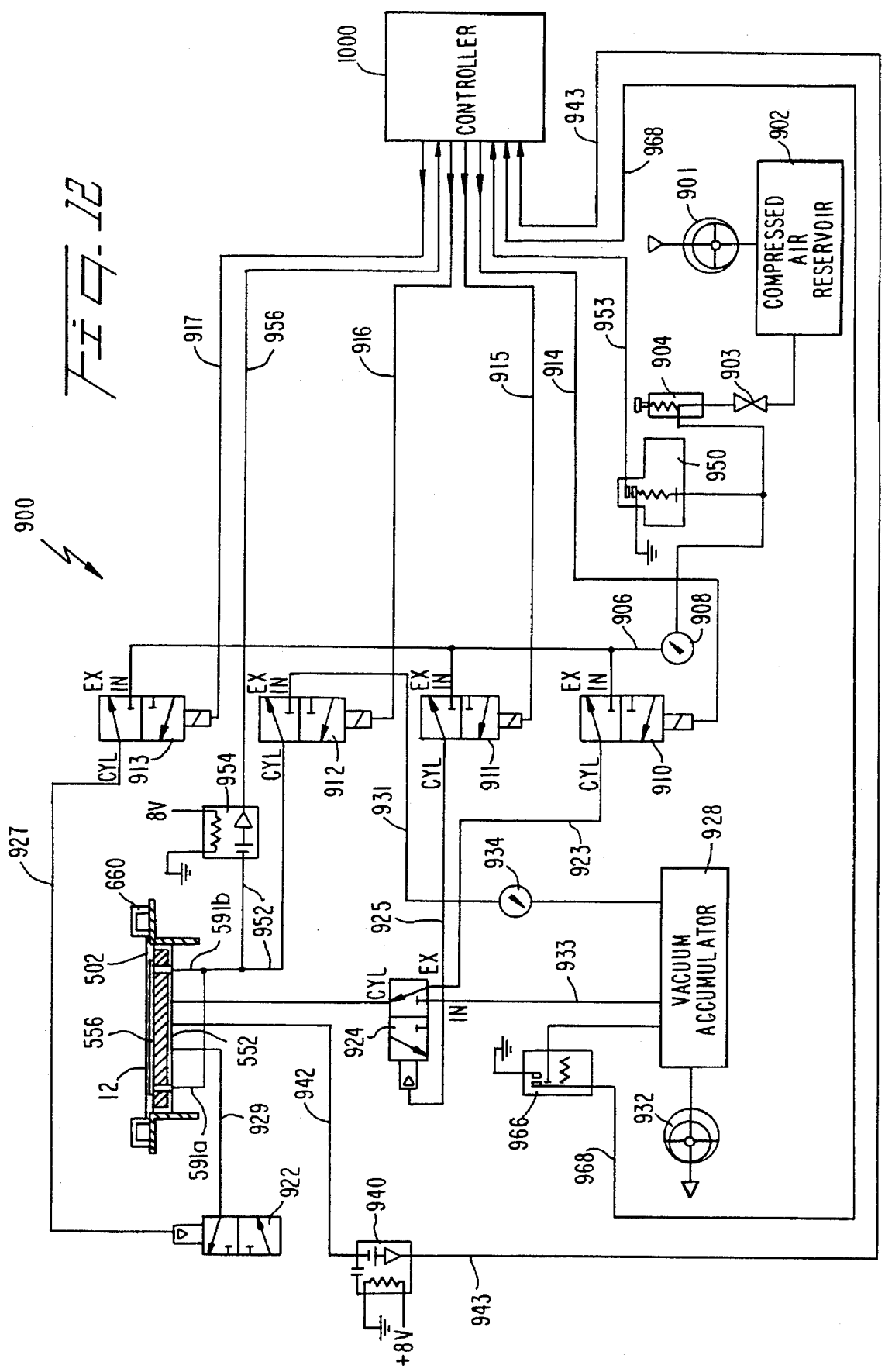
FIG. 12 is a schematic diagram of the screen vacuum hold-down system used with the apparatus of FIG. 1.
Figure 13:
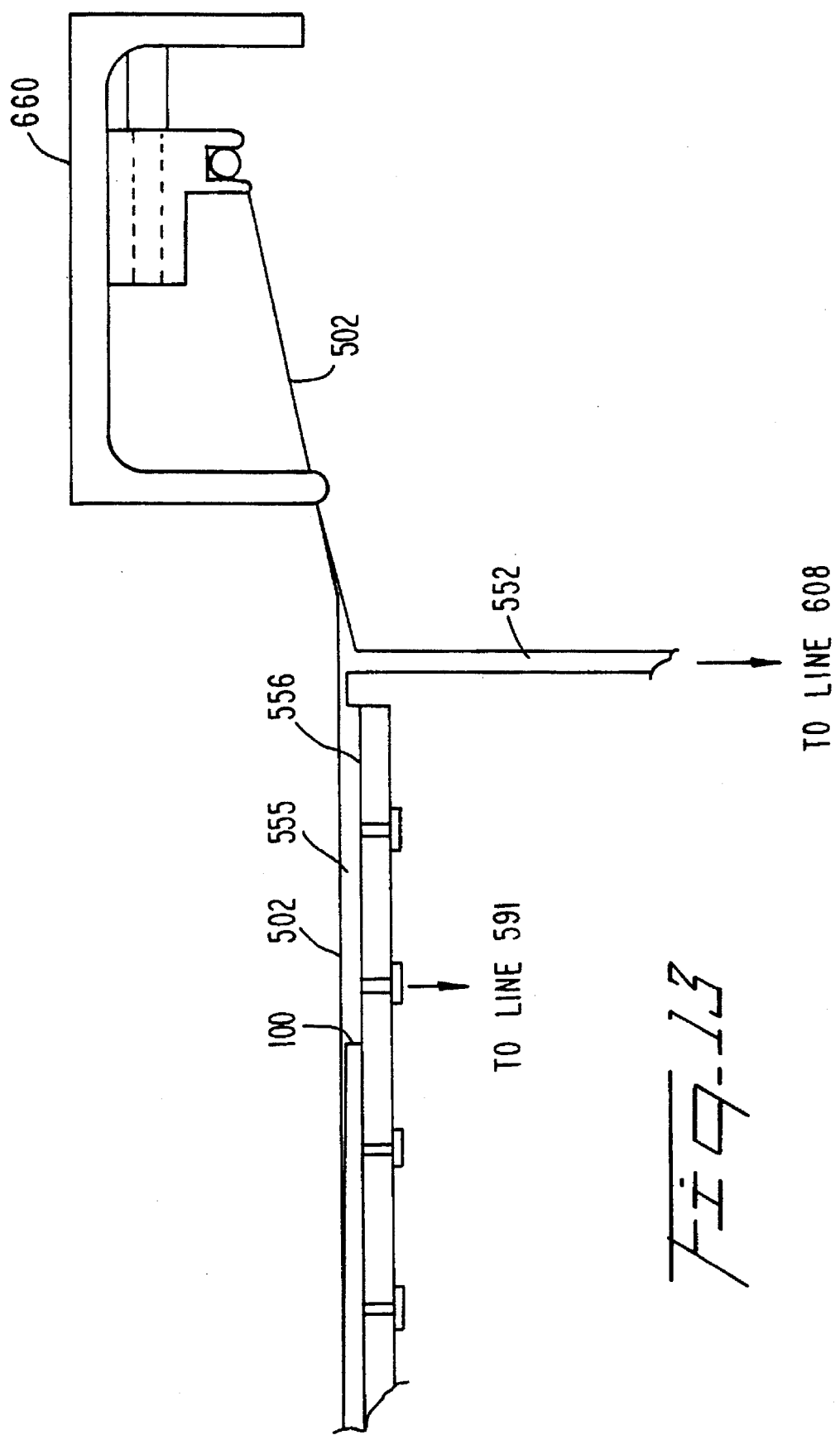
FIG. 13 is a cross-sectional view of the printing screen in contact with the substrate in response to a vacuum applied by the vacuum hold-down system of FIG. 12.

Referring again to FIG. 2, support member 531 has two threaded evacuation ports 604 and 605 into which conventional air-tight fittings 606 and 607 are threaded, respectively. Fittings 606 and 607 are coupled in standard fashion to air-tight hoses 608 and 609, respectively, which are fed to vacuum hold-down system 900 (FIG. 12), discussed hereinafter. The locations of ports 604 and 605 in support member 531 are shown in FIG. 3a. Referring to FIG. 8, rear member 709 has a pair of threaded evacuation ports 611 and 612 into which conventional air-tight fittings 613 and 614, respectively, are threaded. Hose 608 is connected between fitting 606 and 613, while hose 609 is connected between fittings 607 and 614. Fitting 613 is connected to conventional pilot activated valve ("PAV") 924 by pneumatic line 930 and fitting 614 is connected to PAV 922 by pneumatic line 929. The output of PAV 924 is connected through fittings 616 and 618 to pneumatic line 933. Line 933 is connected, in turn, to vacuum accumulator 928, as shown in FIG. 12. The output of PAV 922 is vented to atmosphere.

A third evacuation port 619 is located in side member 705, as also shown in FIGS. 2 and 8. A conventional hose barb 621 is inserted into this port and a pneumatic line 942 connected thereto. Line 942 is fed to a conventional vacuum transducer 940, as shown in FIG. 12.

FIG. 8 also illustrates the four hoses 591, designated for clarity as 591a, 591b, 591c and 591d, each of which is connected at its input to a fitting 589, as shown in FIG. 2. The output end of these hoses is connected to a manifold 595, the output of which is connected to hose 952, as also shown in FIG. 12.

As shown in FIG. 3a, side member 705 of support frame 530 is supported by angle brackets 713 and 715, side member 707 is supported by angle brackets 717 and 719, rear member 709 is supported by angle brackets 721 and 723, and front member 711 is supported by angle brackets 725 and 727. These brackets too are preferably made of aluminum. A side view of rear bracket 721 and front bracket 725, showing the shape of these brackets is found in FIG. 7b. In the preferred embodiment support frame 530 is welded to rear plate 709 and front plate 711, as shown in FIG. 7b.

The bottom, side and top views of product carrier 550 are shown in FIGS. 4a, 4b and 4c, respectively. Referring to FIG. 4a, product carrier 550 has four symmetrically spaced threaded bores 563 into which vertical adjustment bolts are threaded. As shown in FIG. 4b, each opening 563 has a larger diameter portion 620, which receives the unthreaded shaft of bolts 564, and a smaller diameter portion 622, which receives the threaded portion of bolts 564.

Referring again to FIG. 4a, evacuation channels 624 and 626 are cut into product carrier 550 at right angles, dividing it into four quadrants. These channels provide a vacuum path for screen hold-down when product carrier 550 is in the fully "down" position, i.e., resting on the upper surface of support member 531. Channels 624 and 626 extend to the edges of product carrier 550, thus allowing air to flow during screen pull-down through evacuation channel 552 to evacuation port 604 (see FIG. 2) in the direction shown by arrows 625 and 627. Platen hold-down channels 554 in the upper surface of product carrier 550 are shown in FIG. 4c. Each of these channels intersects two manifold grooves 630 at right angles and these grooves intersect four threaded bores 622. Two dowel holes 634 and 636 on opposite corners of the upper surface of product carrier 550 are used for positioning platen 556 on the product carrier, as described hereinafter. Electric light bulbs 593 are mounted along each side of the top surface of product carrier 550 and wired in parallel through a switch on the control panel, not shown, to an external source of electricity. The light bulbs are switched on during set-up, as described hereinafter.

Referring to FIG. 5, platen 556 is shown as having a plurality of vacuum hold-down holes 640 in a symmetrical pattern. In the preferred embodiment the platen is a 1/16th inch thick rectangular sheet of LEXAN®, the corners of which are bevelled, and has 357 holes drilled therethrough in the symmetrical pattern shown. Two dowel holes 642 and 644 are drilled in opposite corners of platen 556, which may be aligned with dowel holes 634 and 636, respectively, in product carrier 550. Platen 556 is then registered in alignment with product carrier 550 by inserting two dowels, not shown, one through holes 642 and 634, and the other through holes 644 and 636. When platen 556 is registered with product carrier 550, hold-down holes 640 are aligned with channels 554 in product carrier 550.

Referring again to FIGS. 1 and 2, screen holder 504 employs an extruded channel 660 having U-shaped cross-section. In the preferred embodiment channel 660 is made of aluminum, although it should be understood that other materials may be used. Four sections of such channel are welded together into a rectangular frame, as shown in FIG. 1. In FIG. 1 screen holder 504 is in a partially open position, while in FIG. 2 it is in the fully down position.

A tensioning bar 662, shown in cross-section in FIG. 2, runs the length of channel 660 and is secured to the top portion 664 of U-shaped channel 660 by a plurality of securing bolts 666. Referring to FIG. 6, securing bolts 666 are fed through a plurality of bores 667 spaced symmetrically about channel 660. Referring again to FIG. 2, a plurality of tension adjusting bolts 668 are secured to tensioning bar 662 through outside leg 675 of U-shaped channel 660. Again, bolts 668 are spaced symmetrically along the length of channel 660. Tensioning bar 662 has an offset portion 670 which has two legs 672 forming a U-shaped recess 673 that accepts a tensioning rod 674 therein. The inner sides of legs 672 are tapered inwardly so that the entrance to recess 673 is slightly wider than the diameter of rod 674 combined with a single wrap of screen 502, while the bottom of recess 673 is slightly narrower than the rod 674/screen 502 combination, so that when rod 674 is inserted therein it is held snugly. In the preferred embodiment tensioning rod 674 is made of stainless steel and may be inserted along the entire length of channel 660.

Printing screen 502 passes over the inside leg 676 of channel 660, over leg 672 and is secured in recess 673 by tensioning rod 674. Inside leg 676 has a rounded bottom 677 and is slightly longer than outside leg 675. Screen 502 is stretched taut by adjusting bolts 666 around the periphery of channel 660. Inside leg 676 is rounded to reduce the likelihood of tearing screen 502 where the two come in contact. Support frame 530 has a channel 678 spaced around the periphery of recess 532, as shown more clearly in FIG. 7a.

Referring again to FIG. 2, a seal 680 is inserted into channel 678, so that when U-shaped channel 660 is in the fully down position, rounded bottom 677 of inner leg 676 rests on the seal. In the preferred embodiment seal 680 is made of very low durometer rubber (e.g., 50–60 DUR). Since rounded bottom 677 is pulled downward into seal 680 by vacuum pressure during the printing operation, slightly shorter outside leg 675 rests against the top surface of support frame 530 when screen holder 504 is in the fully-down position.

As indicated above, screen 502 has been treated in conventional manner before insertion into holder 504 so that the openings therein define the desired pattern to be printed on substrate 100. When ink of sufficient viscosity is applied to the upper surface of screen 502, these openings remain covered prior to printing. In the preferred embodiment, the ink has a minimum viscosity of approximately 200,000 centipoise. Thus, when screen 502 is tautly mounted in screen holder 504, as described above, and holder 504 is in the fully-down position, two parallel air-tight paths are defined, one for screen hold-down and the other for substrate hold-down during the printing operation.

Referring again to FIG. 2, the screen hold-down path begins with the region 555 between screen 502 and platen 556, and continues along evacuation channel 552 to evacuation port 604, through fitting 606, hose 608, and fitting 613 (FIG. 8) to vacuum hold-down system 900, shown in FIG. 12. When a vacuum is drawn along this path, screen 502 is deflected downward into contact with substrate 100, and ink on the upper surface of screen 502 is drawn through the openings therein into contact with substrate 100. When the vacuum is released, screen 502 returns to its normal unstretched position, but a quantity of ink is transferred to the surface of substrate 100 through a combination of vacuum and meniscus forces, thereby defining the desired pattern on substrate 100.

The substrate hold-down path begins with vacuum hold-down hole 640 in platen 556, and runs through channels 554 and manifold grooves 630 in product carrier 550, hollow shafts 584 and 586 in vertical adjusting bolt 564, bore 588 in vertical adjustment mount bracket 567, fitting 578 and hose 591 to vacuum system 900. The vacuum drawn through this path holds substrate 100 firmly in contact with platen 556 during the printing operation so that it does not move in response to meniscus forces when screen 502 returns to its unstretched rest position.

Referring to FIG. 8, the four vertical adjustment bolts 564 are grouped into two pairs and coupled through gearing mechanisms to two hand-operated adjusting knobs 708a and 708b. The operation and structure of only one such mechanism is described below, it being understood that both are identical and work independently.

Two of the vertical adjustment bolts 564, designated for clarity as 564a and 564b, terminate in gears 700 and 701, respectively. Gears 700 and 701 are coupled through right angle gears 702 and 703, respectively, to a common shaft 704. Shaft 704 is fed through an opening 706 in support frame 530 to hand crank 708a. Shaft 704 is supported by two support posts 710 and 712, bolted to support frame 530. Rotating hand crank 708a causes shaft 704 and right angle gears 702 and 703 to rotate in the same direction, thereby rotating bolts 564a and 564b in tandem and raising or lowering one side of product carrier 550, depending on which way crank 708a is rotated. Rotating hand crank 708b causes vertical adjustment of the other side of product carrier 550 in the same manner.

A top view of the horizontal adjusting mechanism is illustrated in FIG. 6. Frame mount arms 506 and 508 are attached to screen holder 504 by clamps 510 and 512, respectively. Since both clamps are identical, only clamp 510 will be described. A support pivot 720 is bolted with two bolts 722 and 724 to the top portion 664 of U-shaped channel 660. A pivot pin 726 projects out of support pivot 720. As illustrated in FIG. 9, frame mount arm 506 (and likewise frame mount arm 508) is angled upward at the rear portion thereof so that screen holder 504 pivots completely out of the way after a substrate has been printed, thereby allowing the substrate to be removed easily and a new substrate inserted in the printer.

Referring to FIG. 9, pivot pin 726 sits in a saddle 728 in frame mount arm 506. Half-circle clamp 730 is bolted to frame mount arm 506 after pivot pin 726 has been placed in saddle 728 by bolts 732 and 734, as shown in FIG. 6. Frame mount arms 506 and 508 are secured to screen holder 504 at a second location by mounting devices 736 and 738, respectively, as shown in FIG. 6. Again, since these two are identical, only mounting device 736 will be described. This device comprises a bolt 737 which is passed through a slot in frame mount arm 506, a cylindrical sleeve 740 between frame mount arm 506 and U-shaped channel 660, and then loosely tightened in a threaded opening on the side of channel 660. The opposite end of frame mount arm 506 is bolted securely to pivot bar 518 by bolts 750 and 752, while the opposite end of frame mount arm 508 is bolted securely to the other end of pivot bar 518 by bolts 754 and 756. During set-up, screen holder 504 is removed from frame mount arms 506 and 508 by removing bolts 732, 734 and 737, along with half circle clamp 730, from both frame mount arms.

Figure 10B:
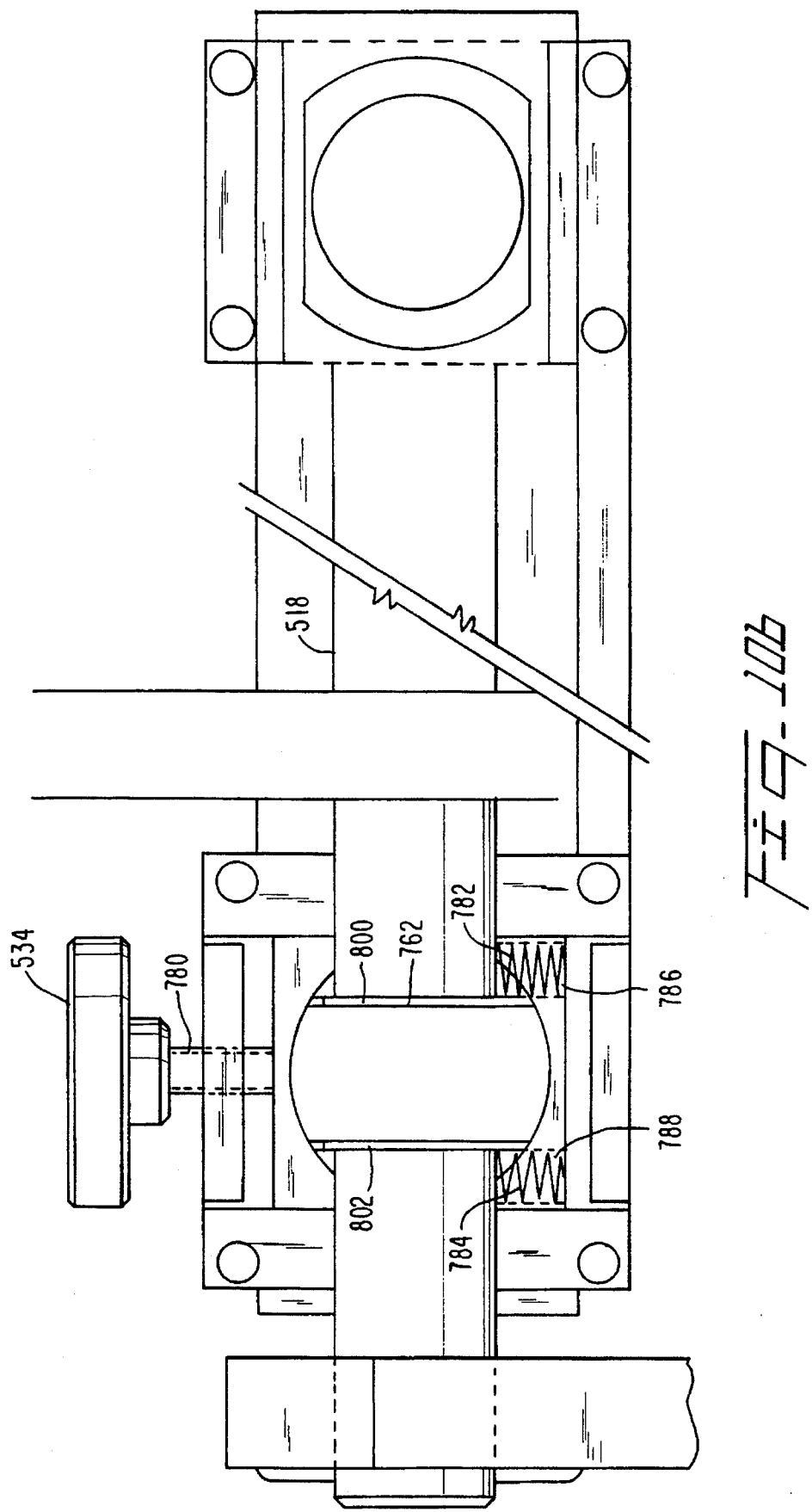
Figure 10C:
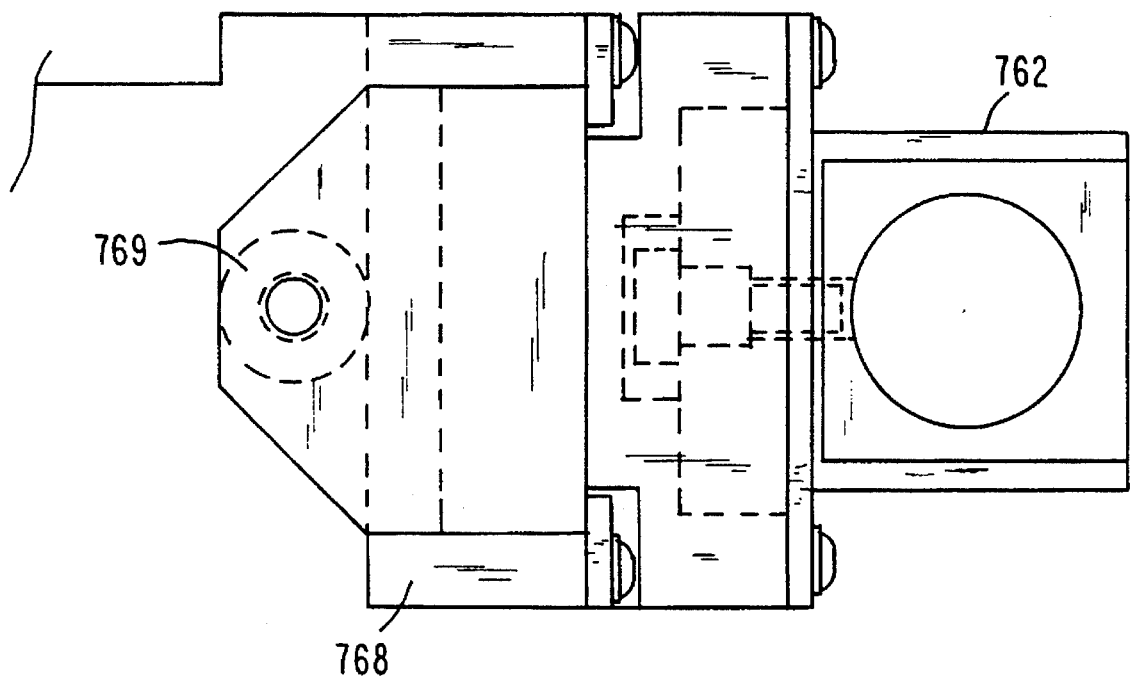

The mechanism for horizontally adjusting the position of screen holder 504 is shown in top view in FIG. 6 and in greater detail in FIGS. 10a–c. Referring to FIG. 6, pivot bar 518 passes through pillow carriers 760 and 762. Carrier 762 is shown in end view in FIG. 10c and in front view in FIG. 10a. Since the support mechanisms for pillow carriers 760 and 762 are identical, with one exception noted below, only the support mechanism for carrier 762 is described.

Referring to FIG. 10a, pillow carrier 762, through which pivot bar 518 passes, is bolted to support housing 764 by ground shoulder head bolt 766, thereby allowing pillow carrier 762 to rotate during adjustment around the Z-axis without movement of pivot bar 518. Support housing 764 is, in turn, mounted to a U-shaped support plate 768. A carrier bar 769 passes through a cylindrical opening in support plate 768 and is bolted to a support plate 770.

X-axis adjusting knob 772 is attached by a bolt 774 to bracket 723, which is welded to support frame 530. Bolt 774 is fed through an opening 778 in support of plate 770 and through a spring 777 which is compressed between support plate 770 and bracket 723, thereby biasing carrier bar 769 to the left, as viewed in FIG. 10*a*. Carrier bar 769 can be shifted to the right, as viewed in this figure, by turning knob 772 clockwise, thereby tightening bolt 774 further into bracket 723.

Pillow carrier 762 is secured to pivot bar 518 by a tension bolt 780 threaded through carrier 762, as shown in FIG. 10*b*. The tension on bolt 780 is controlled by Y-axis adjusting knob 534. A pair of springs 782 and 784 in spring pockets 786 and 788, respectively, preload pivot bar 518. Since pivot bar 518 is secured snugly against pillow carrier 762, rotation of X-axis adjusting knob 772 causes pivot bar 518 to move longitudinally along the X-axis, through the movement of carrier bar 769 and support housing 764. Since frame mount arms 506 and 508 are secured to pivot bar 518, this permits adjustment of screen holder 504 position along the X-axis. Once holder 504 has been precisely positioned along the X-axis, a hex nut 779 is tightened, thereby precluding any further rotation of knob 772. Turning Y-axis adjustment knobs 534 and 536 causes movement of pivot bar 518 along the Y-axis and, consequently, adjustment of the position of screen holder 504 in this direction.

Screen holder 504 can also be rotated around the Z-axis. To accomplish this, a pair of snap rings 800 and 802 are snapped onto pivot bar 518 on either side of mount post 762. Each of these rings is tapered to provide zero backlash. Rings 800 and 802 are attached to pivot bar 518 only at this location and not on either side of pillow carrier 760. Snap rings 800 and 802 prevent pivot bar 518 from sliding in mount post 762 during Y-axis adjustment. Thus, to rotate screen holder 504 around the Z-axis, only one of the Y-axis adjusting knobs 534 and 536 is turned.

Referring to FIGS. 11*a* and 11*b*, in the preferred embodiment substrate 100 is pre-drilled with two locator holes 583 at diagonally opposed corners thereof. These holes are located on substrate 100 outside the area on which printing is to occur. A minimum of two locator tabs 585, each of which has a pin 587, position the substrate on the platen and prevent it from moving laterally during printing. Tabs 585 are made of a thin metal strip, so that substrate 100 rests upon the surface of platen 556, except in the localized area near tabs 585. Pins 587 are sized to precisely slip-fit into locator holes 583 and the ends thereof are rounded to facilitate insertion. It should be understood that a third locator tab and locator hole may be used if desired.

The set up procedure for the printer of the present invention is as follows:

1. The operator removes screen holder 504 from frame mount arms 506 and 508 by removing bolts 732 and 734, clamps 730 and bolts 737 (FIG. 6).

2. The operator turns screen holder 504 upside down and inserts the edges of an untreated screen 502 into U-shaped channel 673. He inserts tensioning rod 674 in channel 673 over the screen and turns bolts 666 and 668 around the perimeter of screen holder 504 until the screen is stretched tautly (FIG. 2).

3. After mounting and tensioning the screen, a one-to-one positive image of the artwork for the circuit is formed on the print screen by a conventional direct light reading photo-transfer process. More specifically, a thin photo-sensitive emulsion coating is applied directly to the screen and allowed to dry. A one-to-one opaque positive artwork on MYLAR® or another transparent substrate is wetted and laid directly onto the emulsion coated top of the screen. Excess water is squeegeed off, bonding the wetted emulsion side of the artwork and the print screen emulsion together by capillary action.

The assembly is allowed to dry and the screen/artwork is exposed to light. This process cures or "hardens" the screen emulsion at all areas exposed to the light source. The areas protected from the light during the exposure process by the artwork positive are uncured and washed clear of the uncured screen emulsion, thus providing a clear outline on the print screen of the desired pattern.

4. After the screen has been prepared the operator attaches screen holder 504 to frame mount arms 506 and 508 using bolts 732, 734 and 737 and clamps 730. Initially the screen holder X-axis travel adjuster and Y-axis travel adjuster are positioned at approximately the mid-point of their travel and the Z-axis travel adjuster is positioned so that screen 502 just contacts the top of substrate 100. This is done to minimize parallax between screen 502 and substrate 100.

5. The operator manually inserts locator pins 587 in each locator hole 583 on the bottom of substrate 100. He places the substrate on the surface of printing platen 556 at the approximate desired location. Back lights 593 under platen 556 are turned on by flipping toggle switch 976 on the control panel (see FIG. 16) and screen 502 with no ink on it is lowered over substrate 100. Since the platen is made of transparent plastic the light is transmitted through it and through the corresponding pre-drilled component mounting holes in substrate 100 (FIG. 4*c*). The operator then visually checks the position of screen 502 and substrate 100. He raises the screen and moves substrate 100 on platen 556 to provide an approximate alignment of the substrate with the art work image on screen 502.

6. With the screen raised the operator manually operates the substrate hold-down system by depressing setup toggle switch 960 on the front panel. A two-digit display 962 on the front panel indicates the percentage of substrate hold-down vacuum, as described below. The operator then slowly moves the substrate within the range of screen adjustment (±¼" along the X-axis or Y-axis in the preferred embodiment) until the hold-down vacuum pressure is maximized. He then tapes locator tabs 585 to the surface of platen 556 with tape 589 (FIG. 11*a*). He next applies non-porous tape 557 to cover the remaining platen hold-down holes 640 which are outside the substrate boundary.

7. The operator lowers screen carrier 504 to the fully-down position and turns on back lights 593. He then adjusts the position of screen carrier 504, using X-axis adjusting knob 772, and Y-axis and yaw adjusting knobs 534 and 536, until screen 502 is in registration with substrate 100 (FIGS. 10*a*, 10*b*). Registration is indicated when light shining through the component mounting holes in substrate 100 from backlights 593 100 shines through the corresponding openings in screen 502. He also adjusts the Z-axis screen-offset height adjustment so that there is a spacing of approximately 0.040 inch between the screen and substrate.

8. The operator removes the substrate used for set-up and installs a protective sheet, not shown, in its place which covers the platen. This sheet prevents the pressure of ink application, described in step 9, from transferring ink to the platen.

9. The operator applies ink to the top of screen 502, spreading it until all openings in the screen are covered.

He then removes the protective sheet applied in step 8.

After set-up the operator initiates printing by activating print vacuum pull-down system 900, a schematic of which is shown in FIG. 12. Pressurized air generated by compressor 901 and stored in compressed air reservoir 902 at approximately 125 PSI is fed through a valve 903 into a regulator 904 so that the pressure on line 906 can be regulated to approximately 35 PSI. Positive pressure sensor interlock 950 in the line between regulator 904 and meter 908 ensures that the positive air pressure level required to operate the system has been reached, as described below. The electrical output of interlock 950 is fed over line 952 to controller 1000, described below. The pressure on line 906 is monitored by meter 908.

The vacuum system of the preferred embodiment employs four conventional solenoid activated valves ("SAV") 910, 911, 912 and 913 and two conventional air pressure (or "pilot") activated valves ("PAV") 922 and 924. These valves are depicted in FIG. 12 in the unenergized state.

Line 906 is connected to the inputs of SAVs 910, 911 and 913, while a vacuum accumulator 928 is connected to the input of SAV 912. SAVs 910, 911, 912 and 913 are controlled by controller 1000, described below, over electrical lines 914, 915, 916 and 917, respectively. The output of SAV 910 is connected over line 923 to the exhaust port of PAV 924, the output of SAV 911 is connected over line 925 to the pilot pressure input of PAV 924, and the output of SAV 913 is connected over line 927 to the pilot pressure input of PAV 922. The output of SAV 912 is connected through line 952 to a line 591 which supplies substrate hold-down vacuum to channels 554 in product carrier 550 which, as described above, are aligned with apertures 558 in platen 556. The output of PAV 924 is connected over line 930 through evacuation port 604 to evacuation channel 552, while the output of PAV 922 is connected over line 929 through evacuation port 611 to evacuation channel 552 (see FIGS. 2 and 8).

The printer employs two analog vacuum level sensors, 940 and 954. Vacuum level sensor 940 is connected to the print chamber over line 942. It measures the vacuum level in the print chamber during printing relative to atmosphere. Sensor 940 generates a voltage of between 0–5 volts DC, with its output proportional to the level of vacuum ranging between 0 to 1 atmosphere. Transducer 940 is powered by an eight volt DC power source. Its output is fed to controller 1000 over line 943, as described below. Vacuum level sensor 954, which is connected through hose 952 to substrate hold-down manifold 595, measures the difference between the vacuum applied to the substrate and atmosphere and performs two functions.

First, vacuum level sensor 954 assists in locating the substrate so that it receives maximum pull-down force during printing. In this regard there typically is leakage when a hold-down vacuum is applied to the substrate because air flows through its pre-drilled holes (used in circuit boards for mounting components), through vacuum hold-down holes 640 in platen 556, and then through channels 554 and manifold grooves 630 in product carrier 550 to the vacuum chamber. However, substrate hold-down can be optimized by positioning it so that the smallest area of component holes is aligned with platen holes 640.

The output of sensor 954 is fed over line 956 to two-digit LED display 962 on the front of control panel 958. The display is calibrated so that total leakage (e.g., when no substrate is present) generates a "00" reading, no leakage (e.g., when none of the substrate holes are aligned with any of the platen holes 640) generates a "99" reading, and intermediate values represent correspondingly proportional amounts of leakage.

When the operator performs the set-up procedures described above he initially positions the substrate in approximate alignment with screen 502. With the screen open he throws setup toggle switch 960 which activates SAVs 912 and 913 and PAV 922. As a result, vacuum accumulator 928 applies a vacuum pull-down over lines 931, 952 and 591 to substrate 100. Since the screen is open, a two-digit readout is generated on display 962 corresponding to the vacuum leakage through the substrate. The substrate is then moved around within the limits defined by the range of movement of the screen, which is approximately ±¼ inch along the X-axis and ±¼ inch along the Y-axis in the preferred embodiment, until the vacuum pull-down on it is optimized, i.e., when the highest number is shown on display 962. The operator then tapes down tabs 585 with tape 589 (FIG. 11b), thereby firmly positioning the tabs so that the substrate pull-down force is maximized.

Second, vacuum level sensor 954 assists in preventing printing if the substrate hold-down pressure falls below a specified level. The operator initiates the function by pressing hold-down store button 964 on the front panel, which loads into memory of controller 1000 the two-digit number corresponding to the optimized substrate hold-down pressure. Should the vacuum hold-down pressure fall below a specified fraction of this optimized value (e.g. 80%), as measured by vacuum level sensor 954, an error indicator interlock switch in controller 1000 (designated by the variable $I_2$, as described below) opens, thereby preventing the print cycle from starting until the problem has been corrected. Reasons for insufficient hold-down pressure include no substrate on the platen, the substrate is warped beyond acceptable limits, vacuum pump 932 has failed, or vacuum accumulator 928 is depleted.

Accumulator 928 has a capacity of 10–15 gallons in the preferred embodiment. It is connected to a conventional vacuum pump 932 which evacuates it to a pressure of approximately 16 inches in the standby mode. A vacuum sensor interlock 966 connected to vacuum accumulator 928 ensures that the vacuum system is on and reaches an acceptable level before the printer can be operated. In the preferred embodiment the minimum pressure needed to close the interlock is approximately 16 inches of Hg. The electrical output of interlock 966 is fed over electrical line 968 to controller 1000. Vacuum pressure in accumulator 928 is monitored by a gage 934.

Figure 14:
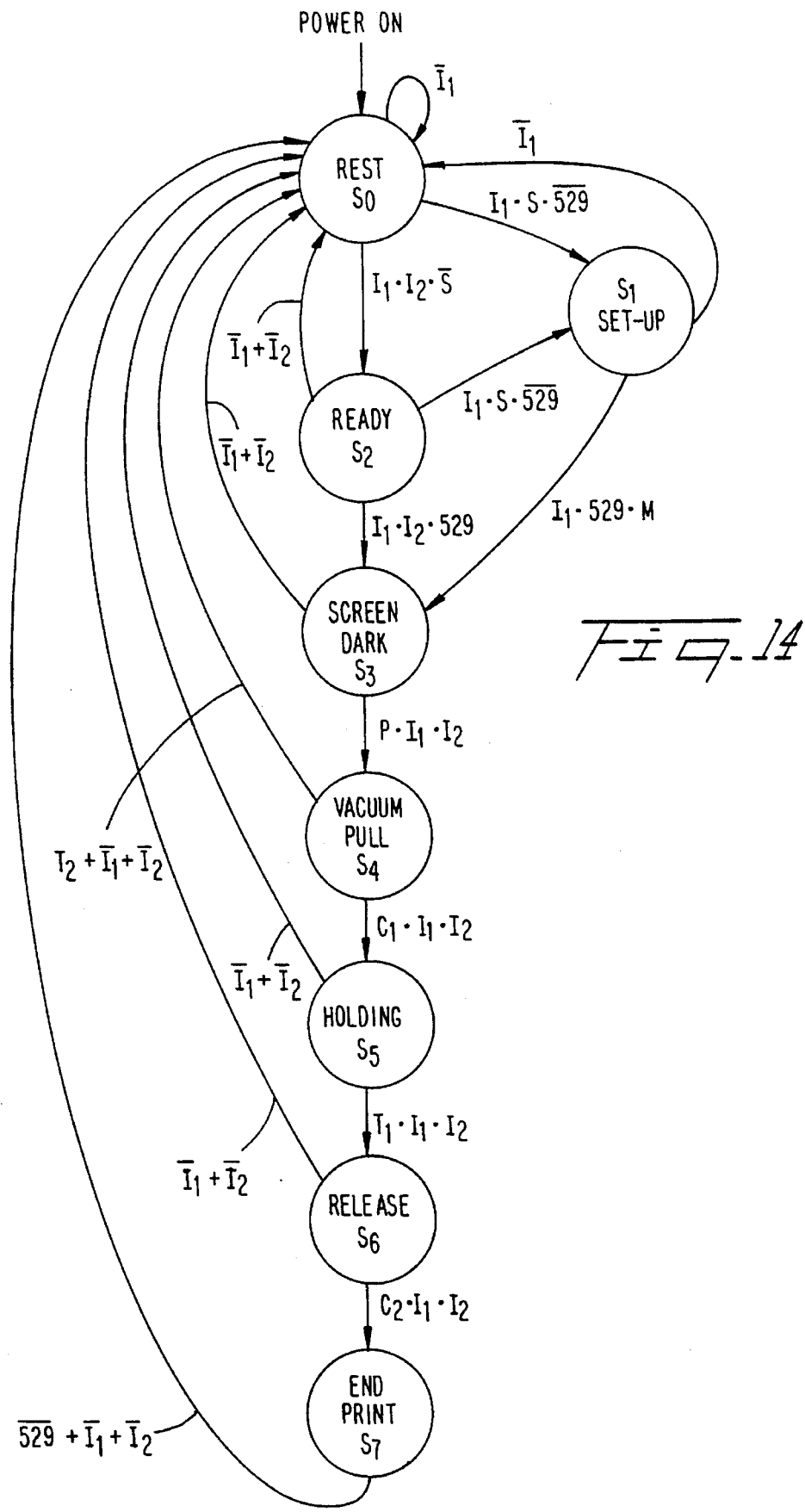
FIG. 14 is a state flow diagram for the vacuum hold-down system of FIG. 12.

Operation of the vacuum control system is best understood with reference to the schematic diagram of this system illustrated in FIG. 12 and the state diagrams of this system is illustrated in FIG. 14 and further described in Tables I and II. Table I is the present state/output table for control of PAVs 910, 911, 912 and 913 by controller 1000 and Table II is a state transition table relating the present state of the vacuum system to various logic variables (i.e., those having a binary value of either "0" or "1") described below. It should be noted in reading Table I that the outputs depend only on the present state. When reading the state flow diagram in FIG. 14, a change from one state to another takes place when the logic statement shown between states is "true."

TABLE I

| Present State | Output Table | | | |
|---|---|---|---|---|
| | SAV 910 | SAV 911 | SAV 912 | SAV 913 |
| $S_0$ | 0 | 0 | 0 | 0 |
| $S_1$ | 0 | 0 | 1 | 1 |
| $S_2$ | 0 | 0 | 0 | 0 |
| $S_3$ | 0 | 0 | 1 | 0 |
| $S_4$ | 0 | 1 | 1 | 1 |
| $S_5$ | 0 | 0 | 1 | 1 |
| $S_6$ | 1 | 0 | 1 | 1 |
| $S_7$ | 0 | 0 | 1 | 0 |

TABLE II

STATE TRANSITION TABLE
(X = DON'T CARE)

| Present State | Inputs | | | | | | | | | | Next State |
|---|---|---|---|---|---|---|---|---|---|---|---|
| | $I_1$ | $I_2$ | P | $C_1$ | $C_2$ | $T_1$ | $T_2$ | S | M | 529 | |
| $S_0$ | 0 | X | X | X | X | X | X | X | X | X | $S_0$ |
| $S_0$ | 1 | 1 | X | X | X | X | X | X | 0 | X | $S_2$ |
| $S_0$ | 1 | X | X | X | X | X | X | X | 1 | 0 | $S_1$ |
| $S_1$ | 0 | X | X | X | X | X | X | X | X | X | $S_0$ |
| $S_1$ | 1 | X | X | X | X | X | X | X | 1 | 1 | $S_3$ |
| $S_2$ | 0 | X | X | X | X | X | X | X | X | X | $S_0$ |
| $S_2$ | X | 0 | X | X | X | X | X | X | X | X | $S_0$ |
| $S_2$ | 1 | X | X | X | X | X | 1 | X | 0 | X | $S_1$ |
| $S_2$ | 1 | 1 | X | X | X | X | X | X | X | 1 | $S_3$ |
| $S_3$ | 0 | X | X | X | X | X | X | X | X | X | $S_0$ |
| $S_3$ | X | 0 | X | X | X | X | X | X | X | X | $S_0$ |
| $S_3$ | 1 | 1 | 1 | X | X | X | X | X | X | X | $S_4$ |
| $S_4$ | 0 | X | X | X | X | X | X | X | X | X | $S_0$ |
| $S_4$ | X | 0 | X | X | X | X | X | X | X | X | $S_0$ |
| $S_4$ | X | X | X | X | X | 1 | X | X | X | X | $S_0$ |
| $S_4$ | 1 | 1 | X | 1 | X | 0 | X | X | X | X | $S_5$ |
| $S_5$ | 0 | X | X | X | X | X | X | X | X | X | $S_0$ |
| $S_5$ | X | 0 | X | X | X | X | X | X | X | X | $S_0$ |
| $S_5$ | 1 | 1 | X | X | X | 1 | X | X | X | X | $S_6$ |
| $S_6$ | 0 | X | X | X | X | X | X | X | X | X | $S_0$ |
| $S_6$ | X | 0 | X | X | X | X | X | X | X | X | $S_0$ |
| $S_6$ | 1 | 1 | X | X | 1 | X | X | X | X | X | $S_7$ |
| $S_7$ | 0 | X | X | X | X | X | X | X | X | X | $S_0$ |
| $S_7$ | X | 0 | X | X | X | X | X | X | X | X | $S_0$ |
| $S_7$ | 0 | 0 | X | X | X | X | X | X | X | 0 | $S_0$ |

When power is turned on by pressing "power on" switch 959, print vacuum pull-down system 900 goes into an initial or "rest" state $S_0$. In this state vacuum pump 932 and air compressor 901 are turned on but SAVs 910, 911, 912 and 913 and PAVs 922 and 924 are deactivated. In its deactivated state PAV 922 connects line 929 and print chamber 552 to atmospheric pressure.

When the vacuum in accumulator 928 and the compressed air in reservoir 902 have reached the specified minimums described above, vacuum interlock 966 and positive pressure interlock 950, respectively, are closed. These interlocks are represented by the logic variable $I_1$, which is "high" (i.e., logic "1") when both interlocks are closed and "low" (i.e., logic "0") when either interlock is open.

Set-up, represented as state $S_1$, may occur only when screen holder 504 is raised so that that microswitch 529 (see FIG. 1) is open (i.e., in the "low" state, or logic "0"). The set-up procedure, described in detail above, is initiated by throwing toggle switch 960, represented by the logic variable "S." During set-up the optimum position of substrate 100 (.i.e., minimum vacuum leakage) is stored in the memory of controller 1000, as described above. When this value is stored, logic variable M goes high. During set-up back-up lights 593 are turned on by throwing toggle switch 976.

The "ready" state is represented by state variable $S_2$. The system will go into this state if the set-up procedure is not initiated. When screen holder 504 is lowered, microswitch 529 closes, putting the system into "screen down" state $S_3$ and activating SAV 912. With SAV 912 activated, vacuum accumulator 928 is connected through line 931 to line 591, thereby pulling substrate 100 down flush onto platen 556. As previously explained, non-porous tape 557 is placed around substrate 100 if it is smaller than platen 556 to prevent the vacuum pressure from bleeding into evacuation channel 552. If the vacuum pressure on substrate 100 is below the minimum threshold, as represented by logic variable 12, the system will return to rest state $S_0$. As explained above, the minimum threshold in the preferred embodiment is 80% of the desired pressure.

Printing is initiated from state $S_3$ by pressing print button 970, represented by logic variable P. When the button is pressed, SAV 913 is activated over line 917 which, in turn, activates PAV 922 over line 927. Activation of PAV 922 disconnects the print chamber from atmospheric pressure. At the same time SAV 911 also is activated which, in turn, activates PAV 924. When PAV 924 is activated vacuum accumulator 928 is connected directly to evacuation channel 552 over line 608.

As vacuum accumulator 928 evacuates channel 552, represented by state variable $S_4$, screen 502 is drawn into contact with substrate 100, thereby resulting in ink transfer through the openings in screen 502. When the vacuum in evacuation chamber 502 reaches a predetermined level, which is set by the operator using thumbwheel switches 972 and read by pressure transducer 940, SAV 911 is deactivated, thereby deactivating PAV 924 and disconnecting vacuum accumulator 928 from evacuation chamber 552. In the preferred embodiment this predetermined level, represented by logic variable $C_1$, is between −0.5 to −0.75 atmospheres. If this level has not been reached within 3 seconds after entering state $S_4$, a logic signal $T_2$ goes "high," returning the system to rest state $S_0$.

If the predetermined vacuum level has been reached within 3 seconds after entering state $S_4$, a timer starts in controller 1000. This level is then maintained for a specified period of time, which expires when logic variable $T_1$ goes "high." This "hold-down" period, represented by state variable $S_5$, is selected by the operator using thumbwheel switches 974. It depends upon the type of substrate used, screen mesh and ink viscosity. For example, if ink having a viscosity of 200,000 centipoise is used with a stainless steel screen having a 320 mesh and a 1/16 inch thick fiberglass printed circuit board substrate, the "hold-down" period may be on the order of 1.5 to 2.0 seconds. The vacuum is held during this "hold-down" period, thereby maintaining screen 502 in contact with substrate 100.

At the end of the "hold-down" period a new state is entered, represented by state variable $S_6$ in which SAV 910 is activated. This results in positive pressure being applied from compressor 901 and regulator 904 through PAV 924 to evacuation channel 552. This positive pressure, in combination with the tension forces on screen 502, causes the screen to separate from substrate 100 and return to its normal undeflected position. When the pressure in evacuation channel 552 reaches atmospheric pressure, as represented by logic variable $C_2$ going "high" and as measured by transducer 940, SAV 910 is deactivated, thereby eliminating the flow of air under positive pressure to evacuation channel 552. In this new state, represented by state variable $S_7$, SAV 913 is deactivated, thereby deactivating PAV 922. This allows evacuation channel 502 to stabilize at atmospheric pressure over line 929 through open PAV 922. Opening PAV 922 to atmosphere avoids a double strike or double print of the pattern while SAV 912 remains activated.

At the conclusion of the print cycle screen holder 504 is raised to its open position, thereby opening microswitch 529 and deactivating SAV 912. With SAV 912 deactivated, vacuum accumulator 928 is disconnected from substrate hold-down line 591, freeing substrate 100 from positive engagement with platen 556 so that it can be removed. This is represented by a return to state $S_0$.

Figure 15:
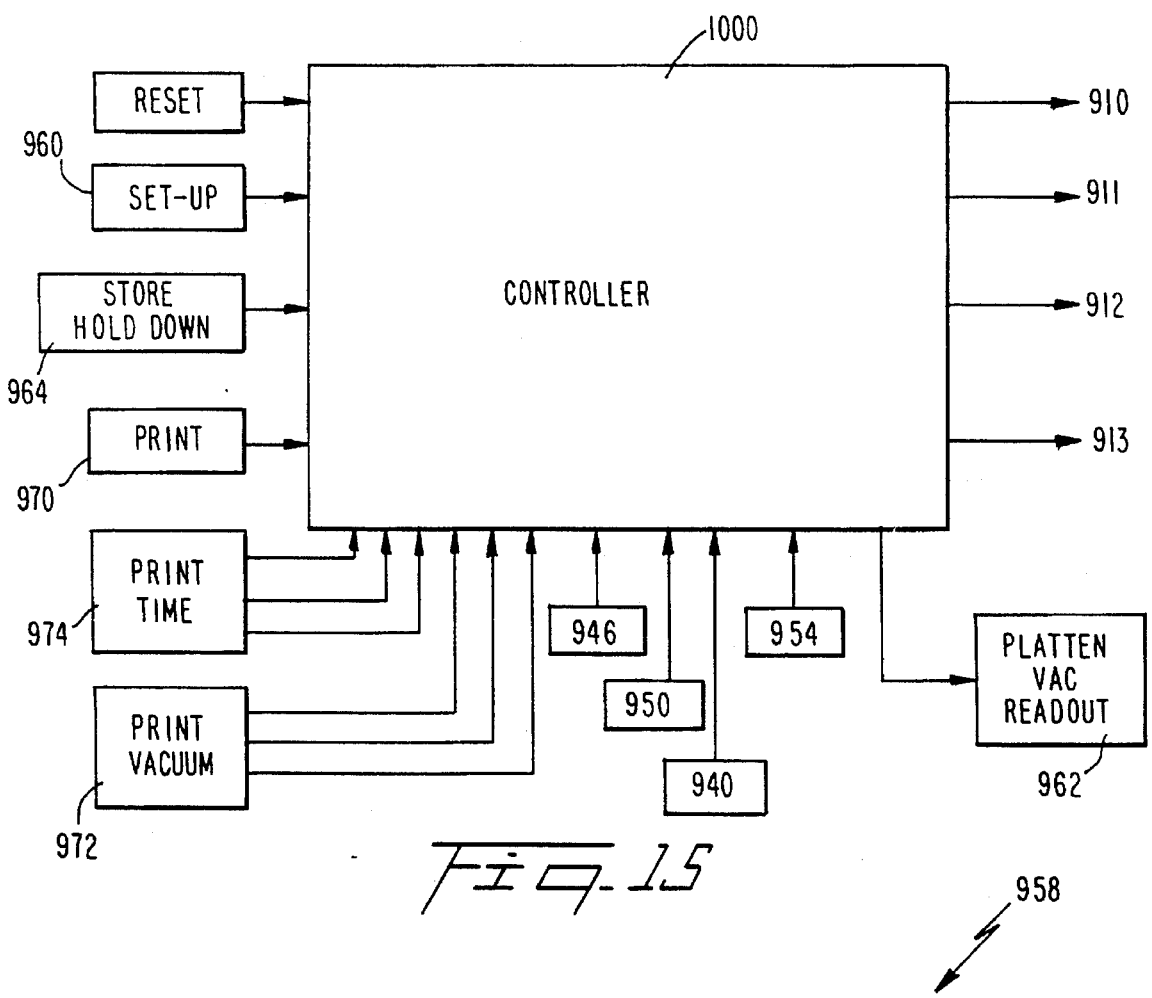
FIG. 15 is a block diagram of the controller used with the vacuum hold-down system of FIG. 12.

Controller 1000, illustrated in FIG. 15, may be either a conventional programmed microprocessor with associated memory or hardwired. It implements the state flow diagram of FIG. 14 and the transition states of Tables I and II, and controls SAVs 910, 911, 912 and 913 in conventional manner.

The inputs to controller 1000 are a manual "reset," the output "S" of set-up toggle switch 960, the output of hold-down store switch 964, the output of print button 970, the output of print time thumbwheel switches 974, the output of print vacuum thumbwheel switches 972, the output of vacuum sensor interlock 946 (over line 948), the output of positive pressure interlock 950 (over line 953), the output of vacuum transducer 940 (over line 943), and the output of vacuum level sensor 954 (over line 956). Controller 1000 controls the operation of SAVs 910, 911, 912 and 913 and platen vacuum readout 962, as described above.

Figure 16:
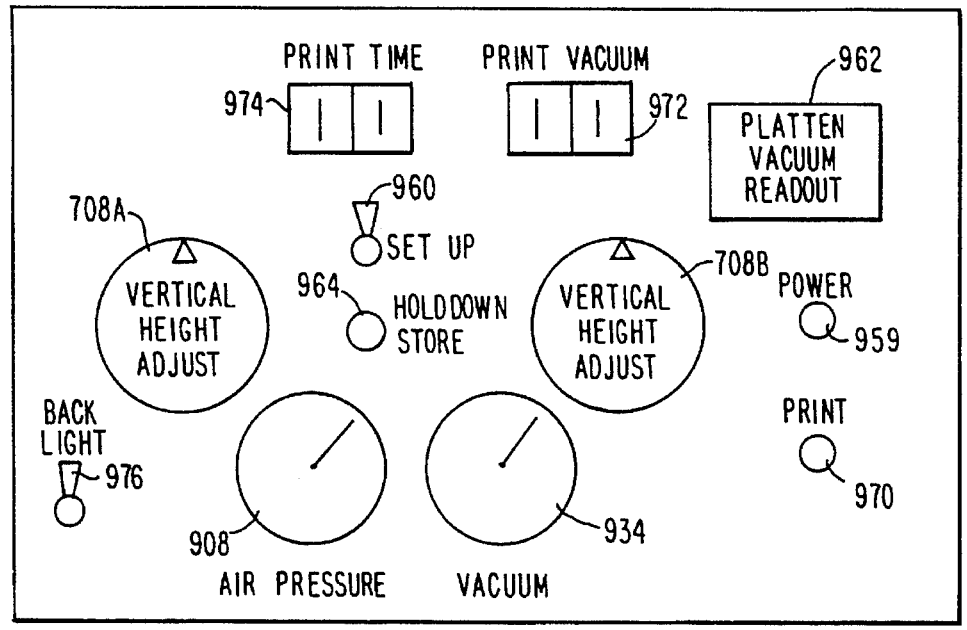
FIG. 16 is a diagram of the front control panel for the apparatus of FIG. 1.

FIG. 16 illustrates control panel 958 of the instant invention. Thus, it shows print time thumbwheel switches 974, print vacuum thumbwheel switches 972, platen vacuum LED readout 962, vertical height adjustment knobs 708A and 708B, set-up toggle switch 960, power button 959, print button 970, vacuum gage 934, air pressure gage 908, back light toggle switch 976 and hold-down store button 964, the operation of all of which are described above.

An important advantage of the foregoing system is that the volume of air evacuated during printing per unit areas of screen size is minimized, thereby allowing it to operate with a small vacuum accumulator and quick response time. This significant savings is achieved in the instant invention because only the region between the substrate and the screen, the narrow region between product carrier 550 and the wall of support frame 530, and evacuation channels 624 and 626 underlying product carrier 550 need be evacuated. In the preferred embodiment less than 0.10 cubic inch of air per square inch of screen need be evacuated for screen hold-down.

While there has been described and illustrated one specific embodiment of the invention, it will be clear that variations in the details of the embodiment specifically illustrated and described may be made without departing from the true spirit and scope of the invention as defined in the appended claims.

What we claim is:

1. A printer for transferring ink deposited on a screen through said screen onto a substrate in a predetermined pattern comprising:

a screen;

a screen holder into which said screen is insertable;

a platen for supporting said substrate in a normally spaced relationship from said screen, said spaced relationship defining a region between said substrate and said screen, said platen containing a plurality of apertures therein;

a product carrier separate from said platen having an upper surface in contact with said platen, said upper surface having a plurality of channels, each of which is aligned with at least one of said apertures;

a support frame having a recess therein for receiving said product carrier;

first means coupled to said support frame and said product carrier for adjusting the position of said product carrier relative to said support frame along a first axis;

second means coupled to said screen holder for adjusting the position thereof around said first axis, along a second axis orthogonal to said first axis and along a third axis orthogonal to said first axis and said second axis, whereby said screen may be registered with said substrate; and means for applying a first partial vacuum to said region to deflect a portion of said screen containing said predetermined pattern into contact with said substrate, whereby said ink is transferred onto said substrate.

2. The printer of claim 1, further comprising means for applying a second partial vacuum through said channels and said apertures to said substrate.

3. The printer of claim 1, further comprising means for assisting lift-off of said screen from said substrate.

4. The printer of claim 1, wherein said first means comprises a plurality of apertures and a plurality of positioning bolts, each of which is threaded into a corresponding one of said plurality of apertures.

5. The printer of claim 1, wherein said screen holder comprises:

a tensioning frame; and means coupled to said tensioning frame for securing said screen.

6. The printer of claim 5, wherein said tensioning frame comprises a member having a U-shaped cross-section, said member comprising an inside leg, an outside leg and a top portion connecting said first leg to said second leg.

7. The printer of claim 6, wherein said product carrier has a periphery and said support frame has an upper surface extending around said periphery, said upper surface having a channel therein and a sealing member inserted into said channel.

8. The printer of claim 7, wherein said inside leg is pivotable into contact with said sealing member and said outside leg is pivotable into contact with said upper surface of said support frame.

9. The printer of claim 8, wherein said inside leg has a rounded end.

10. The printer of claim 6, wherein said securing means comprises:

a tensioning bar extending within and along the length of said tensioning frame, said bar having an offset portion with a recess therein; and a tensioning rod insertable into said recess, whereby said screen may be secured to said tensioning bar by said tensioning rod.

11. The printer of claim 10, wherein said tensioning rod is made of stainless steel.

12. The printer of claim 1, wherein said second means comprises:

a pivot bar;

a pair of frame mount arms, each of which is connected at one end to said pivot bar and at the other end to said screen holder;

a carrier bar;

a pair of pillow carriers rotatably coupled to said pivot bar;

a pair of Y-axis adjusting means, each of which is connected to a corresponding one of said pillow carriers, for adjusting said pivot bar along said second axis;

a pair of support housings, each of which is mounted to a corresponding one of said pillow carriers and is fixably mounted to said carrier bar; and X-axis adjusting means connected to said carrier bar for adjusting the position of said carrier bar and said pivot bar along said third axis.

13. The printer of claim 1, wherein said platen is made of plastic.

14. The printer of claim 1, further comprising means for maintaining said substrate on said platen at a predetermined location.

15. The printer of claim 14, wherein said means for maintaining the location of said substrate comprises a plurality of locator tabs attachable to said platen, each of which has a locator pin engageable with a corresponding aperture in said substrate.

16. The printer of claim 1, wherein said means for applying said first partial vacuum comprises:

a vacuum pump;

a vacuum accumulator coupled to said vacuum pump;

a plurality of pilot activated valves hydraulically coupled to said vacuum accumulator;

a plurality of solenoid activated valves, each of which operates said pair of pilot activated valves; and a controller for operating said solenoid activated valves in a predetermined sequence.

17. A printer for depositing conductive inks onto a nonconductive substrate in a predetermined pattern, comprising:

a platen for supporting said substrate, said platen having a plurality of apertures therein;

a product carrier separate from said platen having an upper surface in contact with said platen, said upper surface having a plurality of channels therein, each of which is aligned with at least one of said apertures;

a flexible printing screen;

a screen holder to which said flexible printing screen is securable in spaced relationship from said substrate, thereby defining a region between said screen and said substrate;

first means for adjusting the position of said screen holder, whereby said printing screen may be registered with said substrate;

means for applying a first partial vacuum to said region to deflect a portion of said screen containing said predetermined pattern into contact with said substrate, whereby said ink is transferred onto said substrate in said predetermined pattern, wherein said first means comprises:
 means for adjusting the position of said screen holder around a first axis orthogonal to the upper surface of said product carrier and along a second axis orthogonal to said first axis; and
 means for adjusting the position of said screen holder along a third axis orthogonal to said first axis and said second axis.

18. The printer of claim 17, wherein said means for adjusting the position of said screen holder around said first axis comprises:

a pivot bar;

a pair of frame mount arms, each of which is connected at one end to said pivot bar and connected at the other end to said screen holder; and means for supporting said pivot bar and for adjusting the position thereof around said first axis.

19. The printer of claim 18, wherein said means for supporting and adjusting the position of said pivot bar comprises:

a pair of pillow carriers rotatably coupled to said pivot bar; and an adjusting screw coupled to one of said pillow carriers for adjusting said pivot bar around said first axis.

20. The printer of claim 17, wherein said means for adjusting the position of said screen holder along said second axis comprises:

a pivot bar;

a pair of frame mount arms, each of which is connected at one end to said pivot bar and connected at the other end to said screen holder; and a pair of pillow carriers rotatably coupled to said pivot bar.

21. A printer for depositing conductive inks onto a nonconductive substrate in a predetermined pattern, comprising:

a platen for supporting said substrate, said platen having a plurality of apertures therein;

a product carrier separate from said platen having an upper surface in contact with said platen, said upper surface having a plurality of channels therein, each of which is aligned with at least one of said apertures;

a flexible printing screen;

a screen holder to which said flexible printing screen is securable in spaced relationship from said substrate, thereby defining a region between said screen and said substrate;

first means for adjusting the position of said screen holder, whereby said printing screen may be registered with said substrate;

means for applying a first partial vacuum to said region to deflect a portion of said screen containing said predetermined pattern into contact with said substrate, whereby said ink is transferred onto said substrate in said predetermined pattern;

second means for adjusting the position of said product carrier along a first axis orthogonal to the upper surface thereof, wherein said product carrier comprises a plate having a plurality of threaded apertures symmetrically spaced therein.

22. The printer of claim 21, wherein said second means comprises a plurality of positioning screws, each of which is threaded into a corresponding one of said plurality of threaded apertures.

23. A method for depositing ink onto a substrate in a predetermined pattern, comprising:

positioning a platen having a plurality of apertures therein onto a threaded movable product carrier having a plurality of channels therein, each of which channels is aligned with at least one of said apertures;

positioning said substrate onto said platen;

applying a first partial vacuum to said substrate through said channels and said apertures to secure said substrate to said platen;

positioning a screen having said predetermined pattern defined therein into registration with said substrate at a predetermined distance above said substrate, wherein a region is defined between said substrate and said screen;

coating said screen with said ink; and applying a second partial vacuum to said region, whereby said screen is deflected into contact with said substrate and a portion of said ink is transferred through said screen onto said substrate in said predetermined pattern, wherein said screen positioning comprises:
  securing said screen to a screen holder;
  rotating said screen holder about a first axis normal to surface of said screen;
  positioning said screen holder along a second axis orthogonal to said first axis; and
  positioning said screen holder along a third axis orthogonal to said first axis and said second axis.

24. An improved printer for depositing a viscous material onto a substrate comprising:

a platen having a first surface for supporting said substrate and having a plurality of apertures therein;

carrier means separate from said platen and in contact with said platen for moving said platen along a first axis perpendicular to said first surface;

means for temporarily adhering said substrate to said platen by applying a first partial vacuum to said platen through said apertures;

a printing screen having a second surface upon which said viscous material is stored prior to deposition thereof on said substrate;

a screen holder for aligning said second surface essentially parallel to said first surface and in spaced relationship therefrom before said viscous material is deposited on said second surface, said spaced relationship defining a region between said substrate and said printing screen; and means for applying a second partial vacuum to said region to deflect said printing screen into temporary contact with said substrate, whereby said viscous material is transferred from said second surface onto said first surface, wherein said means for applying said second partial vacuum comprises:
  a vacuum pump;
  a plurality of pilot activated valves coupled between said vacuum pump and said region;
  a plurality of solenoid activated valves, each of which is coupled to and controls each of said pilot activated valves; and
  a controller for activating said solenoid activated valves in a predetermined manner.

25. A printer for transferring ink deposited on a screen through said screen onto a substrate in a predetermined pattern comprising:

a screen holder in which said screen may be inserted;

a platen for supporting said substrate in a normally spaced relationship from said screen, said spaced relationship defining a region between said substrate and said screen;

a product carrier having an upper surface in contact with said platen;

a support frame having a recess therein for receiving said product carrier;

a plurality of adjusting bolts coupled to said support frame and said product carrier for adjusting the position of said product carrier relative to said support frame along a first axis;

second means coupled to said screen holder for adjusting the position thereof around said first axis, along a second axis orthogonal to said first axis and along a third axis orthogonal to said first axis and said second axis, whereby said screen may be registered with said substrate; and means for applying a first partial vacuum to said region to deflect a portion of said screen containing said predetermined pattern into contact with said substrate, whereby said ink is transferred onto said substrate.

26. An improved printer for depositing a viscous material onto a substrate comprising:

a platen having a first surface for supporting said substrate and having a plurality of apertures therein;

carrier means separate from said platen and in contact with said platen for moving said platen along a first axis perpendicular to said first surface;

means for temporarily adhering said substrate to said platen by applying a first partial vacuum to said platen through said apertures;

a printing screen having a second surface upon which said viscous material is stored prior to deposition thereof on said substrate;

a screen holder for aligning said second surface essentially parallel to said first surface and in spaced relationship therefrom before said viscous material is deposited on said second surface, said spaced relationship defining a region between said substrate and said printing screen; and means for applying a second partial vacuum to said region to deflect said printing screen into temporary contact with said substrate, whereby said viscous material is transferred from said second surface onto said first surface, means for adjusting the position of said printing screen along a second axis perpendicular to said first axis and along a third axis perpendicular to said first axis and said second axis.

27. A method for depositing viscous material through a printing screen having apertures therethrough onto a substrate in a predetermined pattern, comprising:

positioning a platen having an upper surface and apertures therethrough onto a separate movable product carrier having a plurality of channels on an upper surface thereof, wherein said upper surface is perpendicular to a first axis and each of said channels is aligned with at least one of said apertures;

positioning said substrate onto said platen;

positioning said printing screen perpendicular to said first axis;

spacing said substrate a predetermined distance from said screen, thereby defining a region between said substrate and said screen;

applying said viscous material to said printing screen;

applying a partial vacuum to said region, whereby said printing screen is deflected into contact with said substrate;

laterally positioning said screen, whereby apertures in said screen are aligned in registration with apertures in said substrate.

* * * * *